(12) United States Patent
Hsu et al.

(10) Patent No.: US 11,355,499 B2
(45) Date of Patent: Jun. 7, 2022

(54) STATIC RANDOM ACCESS MEMORY CELL

(71) Applicant: TAIWAN SEMICONDUCTOR MANUFACTURING CO., LTD., Hsinchu (TW)

(72) Inventors: Jordan Hsu, New Taipei (TW); Yu-Kuan Lin, Taipei (TW); Shau-Wei Lu, Taoyuan (TW); Chang-Ta Yang, Hsinchu (TW); Ping-Wei Wang, Hsinchu (TW); Kuo-Hung Lo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 13 days.

(21) Appl. No.: 16/721,632

(22) Filed: Dec. 19, 2019

(65) Prior Publication Data
US 2020/0126997 A1    Apr. 23, 2020

Related U.S. Application Data

(63) Continuation of application No. 15/354,052, filed on Nov. 17, 2016, now Pat. No. 10,515,969.

(51) Int. Cl.
*H01L 27/11* (2006.01)
*H01L 21/8238* (2006.01)
(Continued)

(52) U.S. Cl.
CPC .. *H01L 27/1104* (2013.01); *H01L 21/823412* (2013.01); *H01L 21/823807* (2013.01);
(Continued)

(58) Field of Classification Search
CPC ..... H01L 21/823892; H01L 21/823821; H01L 27/0928; H01L 27/0922; H01L 27/1104; H01L 27/0924; H01L 29/66537
See application file for complete search history.

(56) References Cited

U.S. PATENT DOCUMENTS

| 3,896,483 A | 7/1975 | Whelan |
| 4,028,716 A | 6/1977 | Van Santen et al. |

(Continued)

OTHER PUBLICATIONS

U.S. Office Action for U.S. Appl. No. 16/721,657, dated Jul. 12, 2021.

*Primary Examiner* — Sophia T Nguyen
(74) *Attorney, Agent, or Firm* — Birch, Stewart, Kolasch & Birch, LLP

(57) ABSTRACT

A static random access memory (SRAM) cell includes substrate, a first semiconductor fin, a first gate structure, a second semiconductor fin, and a second gate structure. The substrate has a first p-well and an n-well bordering the first p-well. The first semiconductor fin extends within the first p-well. The first gate structure extends across the first semiconductor fin and forms a first write-port pull-down transistor with the first semiconductor fin. The second semiconductor fin extends within the n-well. The second gate structure extends across the second semiconductor fin and forms a first write-port pull-up transistor with the second semiconductor fin. A channel region of the first write-port pull-down transistor has a higher doping concentration than a channel region of the first write-port pull-up transistor.

20 Claims, 24 Drawing Sheets

(51) Int. Cl.
*H01L 27/092* (2006.01)
*H01L 21/8234* (2006.01)
*H01L 29/66* (2006.01)
*H01L 27/088* (2006.01)
*H01L 29/49* (2006.01)
*H01L 27/105* (2006.01)

(52) U.S. Cl.
CPC ........... *H01L 21/823821* (2013.01); *H01L 21/823878* (2013.01); *H01L 21/823892* (2013.01); *H01L 27/088* (2013.01); *H01L 27/0922* (2013.01); *H01L 27/0924* (2013.01); *H01L 27/0928* (2013.01); *H01L 29/66803* (2013.01); *H01L 21/823431* (2013.01); *H01L 27/0886* (2013.01); *H01L 27/1052* (2013.01); *H01L 29/4958* (2013.01); *H01L 29/4966* (2013.01); *H01L 29/66545* (2013.01)

(56) References Cited

U.S. PATENT DOCUMENTS

| | | | |
|---|---|---|---|
| 4,340,827 A | 7/1982 | Nishizawa et al. | |
| 4,521,796 A | 6/1985 | Rajkanan et al. | |
| 4,527,255 A | 7/1985 | Keshtbod | |
| 4,707,723 A | 11/1987 | Okamoto et al. | |
| 4,772,926 A | 9/1988 | Nishizawa et al. | |
| 4,873,564 A | 10/1989 | Beasom | |
| 5,141,882 A | 8/1992 | Komori et al. | |
| 5,156,990 A | 10/1992 | Mitchell | |
| 5,416,043 A | 5/1995 | Burgener et al. | |
| 5,670,796 A | 9/1997 | Nishibayashi et al. | |
| 5,734,185 A | 3/1998 | Iguchi et al. | |
| 5,789,776 A | 8/1998 | Lancaster et al. | |
| 5,888,853 A | 3/1999 | Gardner et al. | |
| 5,899,732 A | 5/1999 | Gardner et al. | |
| 5,929,467 A | 7/1999 | Kawai et al. | |
| 6,265,252 B1* | 7/2001 | Lin | H01L 21/823418 257/E21.619 |
| 6,429,063 B1 | 8/2002 | Eitan | |
| 6,586,294 B1 | 7/2003 | Post et al. | |
| 6,683,804 B1* | 1/2004 | Eby | G11C 7/20 365/154 |
| 6,956,262 B1* | 10/2005 | Tsu-Jae | H01L 29/78 257/314 |
| 7,560,382 B2* | 7/2009 | Yang | H01L 27/1104 438/666 |
| 7,920,409 B1 | 4/2011 | Clark et al. | |
| 8,059,452 B2 | 11/2011 | Liaw | |
| 8,349,670 B2* | 1/2013 | Chang | H01L 27/1108 438/153 |
| 8,942,030 B2* | 1/2015 | Liaw | G11C 11/412 365/154 |
| 9,076,552 B2 | 7/2015 | Schaefer et al. | |
| 9,257,439 B2 | 2/2016 | Liaw | |
| 9,418,728 B2 | 8/2016 | Liaw | |
| 9,425,201 B2 | 8/2016 | Liaw | |
| 9,577,637 B2 | 2/2017 | Pedersen | |
| 9,590,072 B1* | 3/2017 | Chou | H01L 29/66537 |
| 9,634,087 B1* | 4/2017 | Xie | H01L 29/1083 |
| 9,640,540 B1 | 5/2017 | Liaw | |
| 9,761,302 B1 | 9/2017 | Lu et al. | |
| 9,768,178 B2 | 9/2017 | Lee et al. | |
| 9,799,660 B1 | 10/2017 | Wong et al. | |
| 9,824,747 B2 | 11/2017 | Liaw | |
| 9,911,744 B2* | 3/2018 | Liaw | G06F 30/398 |
| 10,515,969 B2* | 12/2019 | Hsu | H01L 21/823878 |
| 2004/0217433 A1 | 11/2004 | Yeo et al. | |
| 2006/0006440 A1* | 1/2006 | Liaw | H01L 21/823462 257/296 |
| 2006/0038234 A1 | 2/2006 | Liaw | |
| 2006/0121715 A1 | 6/2006 | Chang et al. | |
| 2006/0146638 A1 | 7/2006 | Chang et al. | |
| 2007/0020827 A1 | 1/2007 | Buh et al. | |
| 2007/0040221 A1* | 2/2007 | Gossner | H01L 29/42392 257/355 |
| 2007/0069302 A1 | 3/2007 | Jin et al. | |
| 2007/0187797 A1* | 8/2007 | Kato | H01L 21/823892 257/500 |
| 2008/0048297 A1* | 2/2008 | Yang | H01L 27/11 257/586 |
| 2008/0308848 A1 | 12/2008 | Inaba | |
| 2008/0308850 A1* | 12/2008 | Berthold | H01L 27/11 257/288 |
| 2009/0014798 A1 | 1/2009 | Zhu et al. | |
| 2009/0108372 A1 | 4/2009 | Chen et al. | |
| 2009/0109768 A1 | 4/2009 | Lee et al. | |
| 2009/0124069 A1* | 5/2009 | Clark, Jr. | H01L 21/26586 438/525 |
| 2009/0173971 A1 | 7/2009 | Houston et al. | |
| 2010/0259971 A1 | 10/2010 | Liaw | |
| 2011/0026308 A1 | 2/2011 | Liaw | |
| 2011/0068413 A1 | 3/2011 | Liaw | |
| 2011/0073958 A1* | 3/2011 | Chang | H01L 27/11 257/390 |
| 2011/0075470 A1 | 3/2011 | Liaw | |
| 2011/0133285 A1 | 6/2011 | Liaw | |
| 2011/0186937 A1* | 8/2011 | Scheiper | H01L 21/823807 257/402 |
| 2011/0195555 A1* | 8/2011 | Tsai | H01L 21/2236 438/301 |
| 2011/0195564 A1 | 8/2011 | Liaw et al. | |
| 2011/0198699 A1 | 8/2011 | Hung et al. | |
| 2011/0269287 A1* | 11/2011 | Tsai | H01L 21/2255 438/306 |
| 2011/0317485 A1 | 12/2011 | Liaw | |
| 2012/0070953 A1* | 3/2012 | Yu | H01L 29/66803 438/301 |
| 2012/0129301 A1 | 5/2012 | Or-Bach et al. | |
| 2012/0146146 A1 | 6/2012 | Anderson et al. | |
| 2012/0205739 A1 | 8/2012 | Yamashita | |
| 2012/0223330 A1 | 9/2012 | Dhar et al. | |
| 2012/0230130 A1* | 9/2012 | Sheppard | G11C 8/14 365/189.011 |
| 2012/0261726 A1 | 10/2012 | Yang et al. | |
| 2012/0275207 A1 | 11/2012 | Houston et al. | |
| 2012/0299106 A1 | 11/2012 | Mann | |
| 2012/0302023 A1* | 11/2012 | Javorka | H01L 29/66537 438/285 |
| 2012/0329220 A1 | 12/2012 | van Bentum et al. | |
| 2013/0026567 A1 | 1/2013 | Merelle et al. | |
| 2013/0109145 A1* | 5/2013 | Mieno | H01L 29/66537 438/305 |
| 2013/0113042 A1* | 5/2013 | Wang | H01L 29/7855 257/347 |
| 2013/0114355 A1 | 5/2013 | Takeuchi et al. | |
| 2013/0121087 A1 | 5/2013 | Liaw | |
| 2013/0181297 A1 | 7/2013 | Liaw | |
| 2013/0235652 A1 | 9/2013 | Liaw | |
| 2013/0249003 A1 | 9/2013 | Oh et al. | |
| 2014/0061814 A1 | 3/2014 | Kim et al. | |
| 2014/0078817 A1 | 3/2014 | Bentum et al. | |
| 2014/0227846 A1* | 8/2014 | Liaw | H01L 29/66545 438/283 |
| 2014/0252475 A1 | 9/2014 | Xu | |
| 2014/0264623 A1* | 9/2014 | Nandakumar | H01L 21/823814 257/371 |
| 2014/0363960 A1 | 12/2014 | Kim et al. | |
| 2014/0374831 A1 | 12/2014 | Liaw | |
| 2015/0008533 A1 | 1/2015 | Liaw | |
| 2015/0017746 A1 | 1/2015 | Yu et al. | |
| 2015/0021699 A1 | 1/2015 | Ando et al. | |
| 2015/0091097 A1 | 4/2015 | Wu et al. | |
| 2015/0102415 A1* | 4/2015 | Hwang | G11C 11/412 257/369 |
| 2015/0132903 A1* | 5/2015 | Liaw | G11C 11/412 438/212 |
| 2015/0137181 A1 | 5/2015 | Basker et al. | |
| 2015/0155015 A1 | 6/2015 | Park | |
| 2015/0171093 A1 | 6/2015 | Liaw | |

(56) References Cited

U.S. PATENT DOCUMENTS

| | | | |
|---|---|---|---|
| 2015/0187763 A1* | 7/2015 | Kim | H01L 27/0924 257/392 |
| 2015/0200010 A1 | 7/2015 | Liaw | |
| 2015/0200194 A1 | 7/2015 | Ju et al. | |
| 2015/0206890 A1 | 7/2015 | Liaw | |
| 2015/0236131 A1* | 8/2015 | Chang | H01L 21/823821 257/401 |
| 2015/0236698 A1 | 8/2015 | Pedersen | |
| 2015/0243667 A1 | 8/2015 | Liaw | |
| 2015/0311125 A1 | 10/2015 | Ju et al. | |
| 2015/0325683 A1* | 11/2015 | Cho | H01L 21/823821 438/283 |
| 2015/0357279 A1 | 12/2015 | Fujiwara et al. | |
| 2015/0364566 A1 | 12/2015 | Liu et al. | |
| 2016/0141387 A1 | 5/2016 | Tseng et al. | |
| 2016/0181257 A1* | 6/2016 | Liaw | H01L 29/7851 257/401 |
| 2016/0217861 A1* | 7/2016 | Ashokkumar | G11C 16/0466 |
| 2016/0260719 A1 | 9/2016 | Chung | H01L 27/0207 |
| 2016/0260721 A1 | 9/2016 | Bowen | |
| 2016/0276224 A1* | 9/2016 | Gan | H01L 29/66537 |
| 2016/0283629 A1 | 9/2016 | Weckx et al. | |
| 2016/0315191 A1* | 10/2016 | Tsai | H01L 21/823814 |
| 2016/0336194 A1 | 11/2016 | Yeh et al. | |
| 2016/0336329 A1* | 11/2016 | Colinge | H01L 29/66666 |
| 2016/0365347 A1 | 12/2016 | Bao et al. | |
| 2017/0033106 A1* | 2/2017 | Walke | H01L 21/823807 |
| 2017/0069634 A1 | 3/2017 | Kim | |
| 2017/0069737 A1 | 3/2017 | Choi et al. | |
| 2017/0117411 A1* | 4/2017 | Kim | H01L 21/823821 |
| 2017/0133373 A1* | 5/2017 | Tan | H01L 21/823842 |
| 2017/0133386 A1 | 5/2017 | Lee et al. | |
| 2017/0194037 A1 | 7/2017 | Fujiwara et al. | |
| 2017/0271343 A1 | 9/2017 | Liaw | |
| 2017/0338233 A1 | 11/2017 | Huang et al. | |
| 2017/0352668 A1 | 12/2017 | Li | |
| 2017/0365527 A1 | 12/2017 | Zhou et al. | |
| 2018/0006039 A1 | 1/2018 | Lee et al. | |
| 2018/0138185 A1* | 5/2018 | Hsu | H01L 21/823878 |
| 2018/0151448 A1* | 5/2018 | Wang | H01L 21/823842 |
| 2018/0323201 A1* | 11/2018 | Yang | H01L 29/785 |
| 2018/0342290 A1* | 11/2018 | Yu | G11C 5/147 |
| 2019/0006372 A1* | 1/2019 | Lu | H01L 21/823842 |
| 2020/0135743 A1* | 4/2020 | Hsu | H01L 27/0924 |

\* cited by examiner

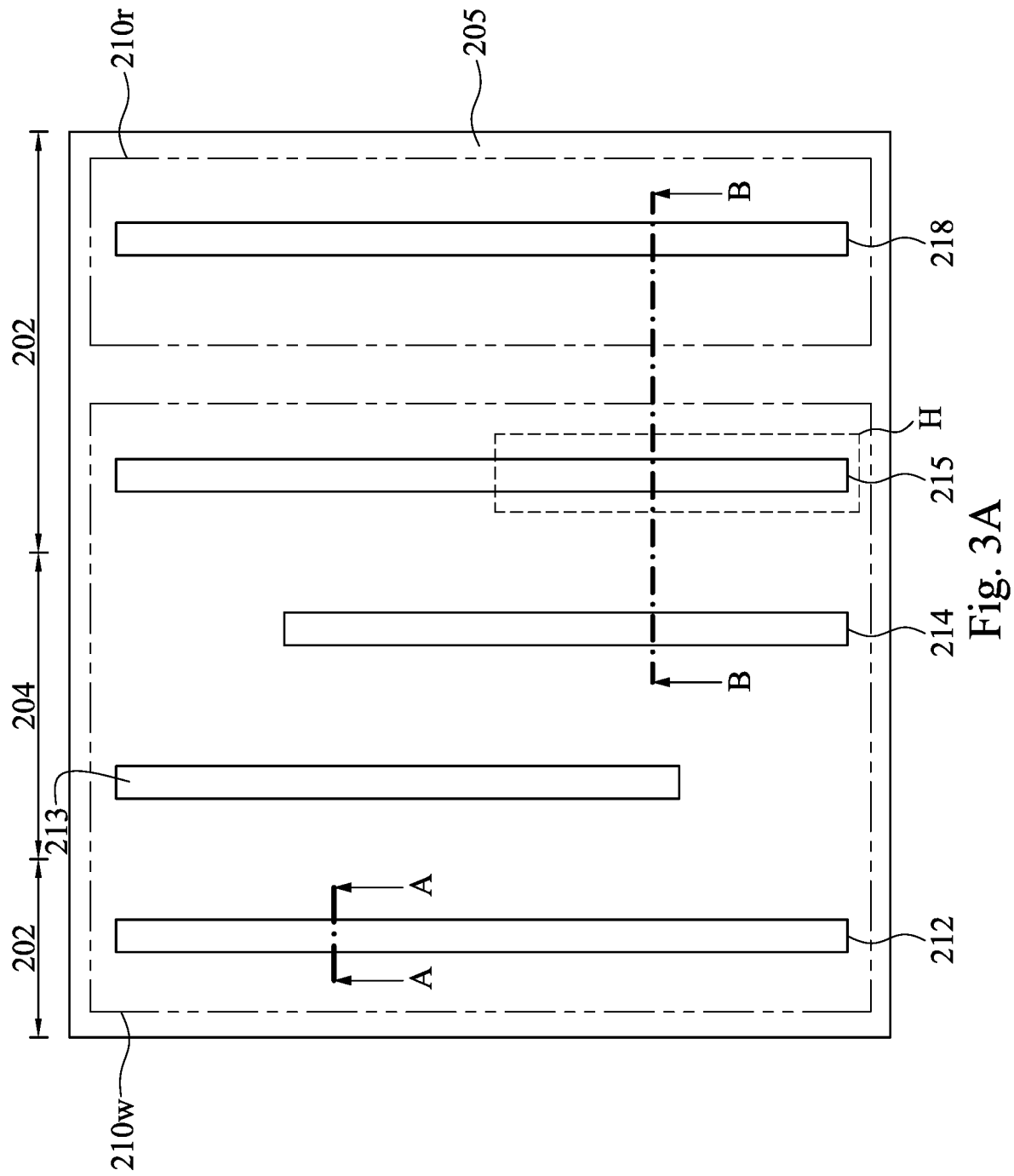

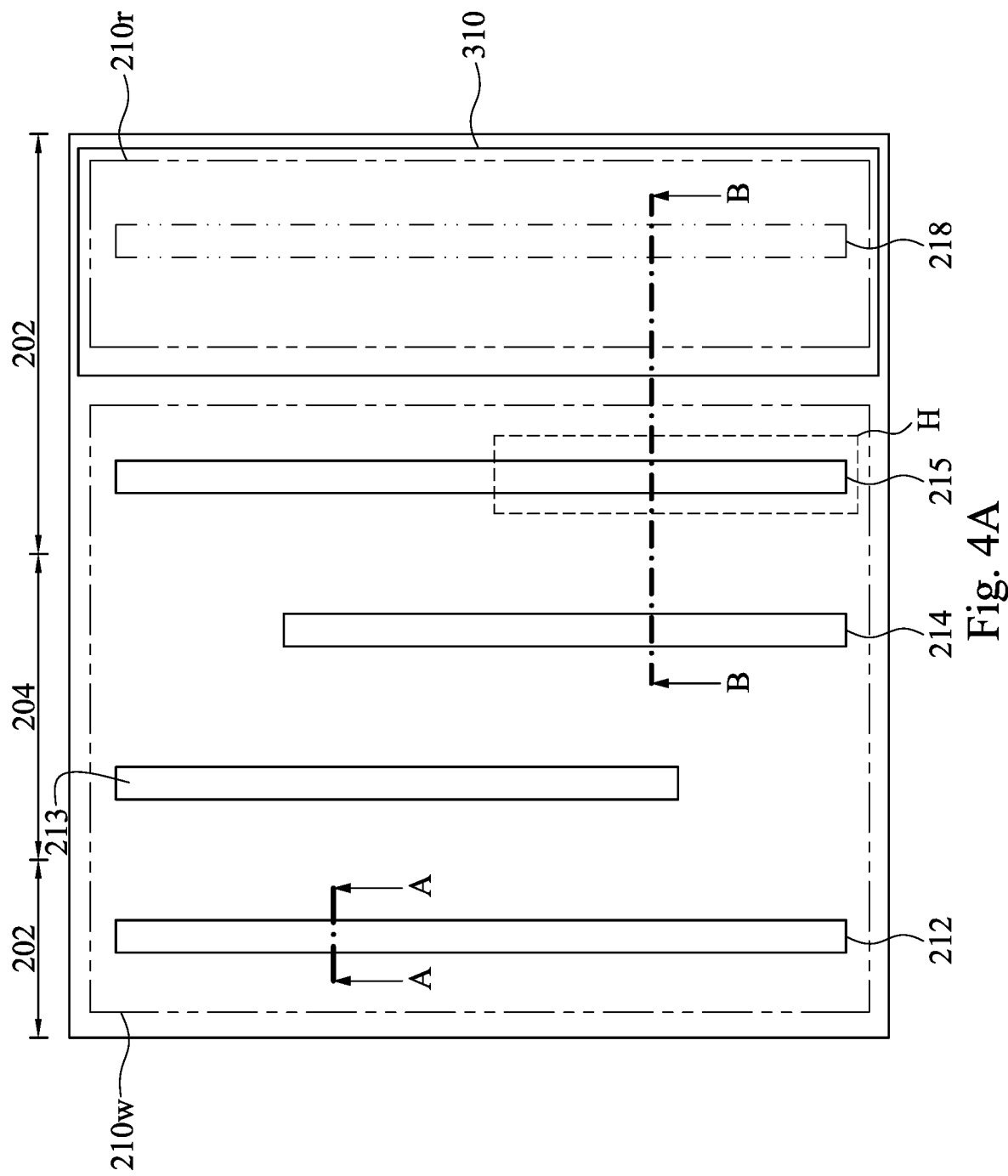

STATIC RANDOM ACCESS MEMORY CELL

PRIORITY CLAIM AND CROSS-REFERENCE

The present application is a continuation Application of the U.S. application Ser. No. 15/354,052, filed Nov. 17, 2016, now U.S. Pat. No. 10,515,969, issued Dec. 24, 2019.

BACKGROUND

A current common demand for an electronic circuit and particularly for electronic circuits manufactured as integrated circuits in semiconductor processes is an on-board or embedded array of memory storage elements. These elements may be provided as dynamic random access memory (DRAM) cells and alternatively as static random access memory (SRAM) cells. DRAM and SRAM memories are described as "volatile" memory cells, in that if the power to the integrated circuit device is removed, the stored data will be lost. SRAM cells retain data so long as a supply voltage is present. Recent system on a chip (SOC) designs often incorporate one or more "cores". These cores are often predesigned popular processors arranged with a level one (L1) cache memory of SRAM cells laid out near or adjacent to the processor to make very fast processing operations possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 8A are top views of a method for manufacturing a semiconductor device at various stages in accordance with some embodiments of the present disclosure.

FIGS. 2B to 8B are cross-sectional views taken along lines A-A and B-B of FIGS. 2A to 8A.

FIGS. 10A to 13A are top views of a method for manufacturing a semiconductor device at various stages in accordance with some embodiments of the present disclosure.

FIGS. 10B to 13B are cross-sectional views taken along lines A-A and B-B of FIGS. 9 to 13A.

DETAILED DESCRIPTION

Figure 1:
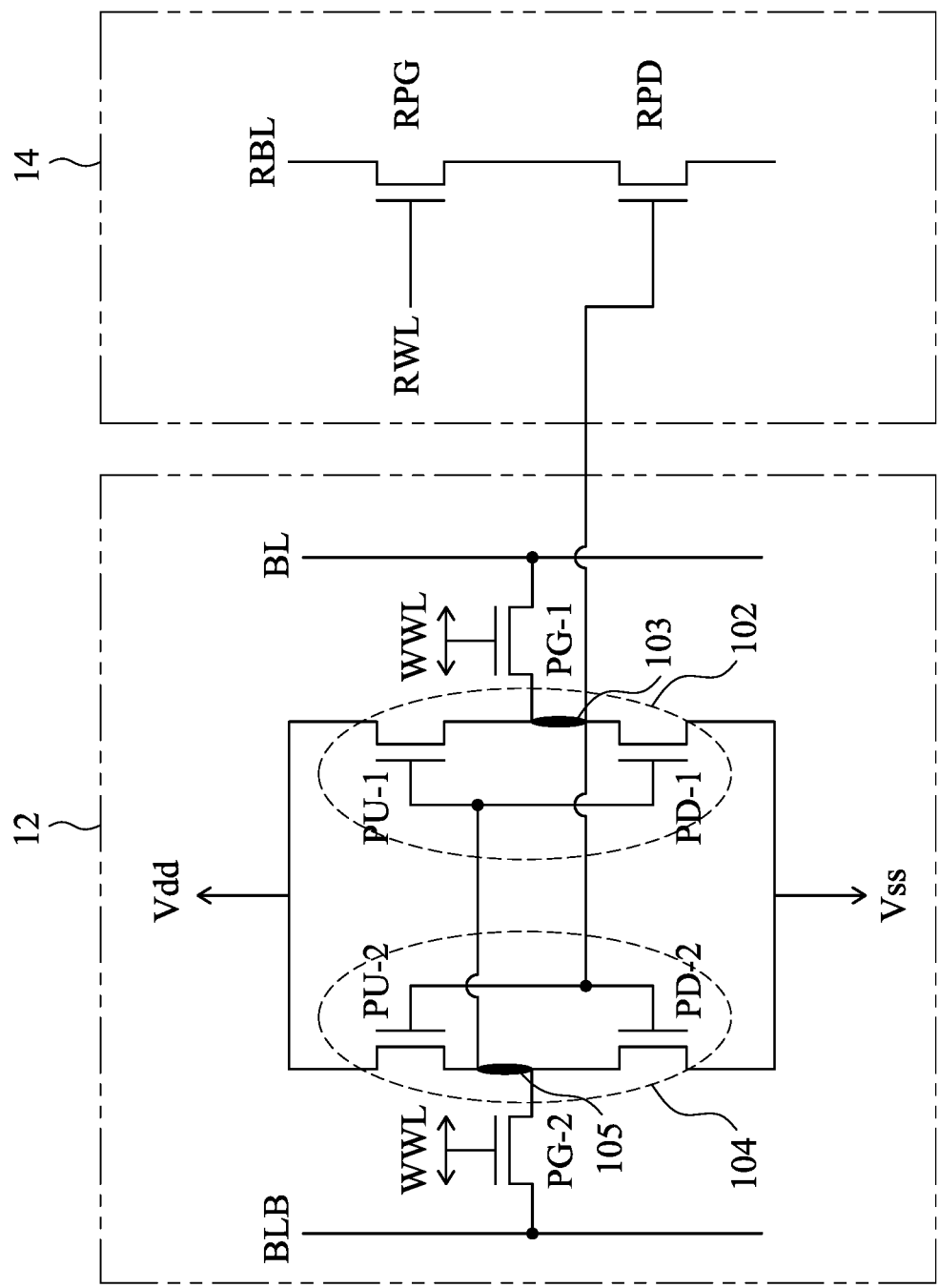
FIG. 1 is a circuit diagram of a semiconductor device 10 in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments, a static random-access memory (SRAM) formed of fin field effect transistors (FinFETs). The embodiments of the disclosure may also be applied, however, to a variety of integrated circuits. Various embodiments will be explained in detail with reference to the accompanying drawings.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This SRAM cell has two stable states which are used to denote 0 and 1. Two additional access transistors (PG-1 and PG-2) serve to control the access to a storage cell during read and write operations.

FIG. 1 is a circuit diagram of a semiconductor device 10 in accordance with various embodiments of the present disclosure. In FIG. 1, the semiconductor device 10 is an eight transistor static random access memory (8T-SRAM) cell. The semiconductor device 10 includes a write port 12 and a read port 14. The write port 12 includes a first inverter 102 formed by a pull-up transistor PU-1 and a pull-down transistor PD-1. The write port 12 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiments, the pull-up transistor PU-1 and PU-2 can be p-type metal oxide semiconductor (PMOS) transistors while the pull-down transistors PD-1 and PD-2 can be n-type metal oxide semiconductor (NMOS) transistors, and the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the semiconductor device 10 can hold the data using a latched structure so that the stored data will not be lost without applying a refresh cycle as long as power is supplied through Vdd.

In FIG. 1, the write port 12 further includes a first pass-gate transistor PG-1 connected between a bit line BL and the output 103 of the first inverter 102. The write port 12 further includes a second pass-gate transistor PG-2 connected between a bit line BLB and the output 105 of the second inverter 104. The gates of the first pass-gate transistor PG-1 and the second pass-gate transistor PG-2 are connected to a word line WWL, which connects semiconductor devices in a row of the SRAM array.

In operation, if the pass-gate transistors PG-1 and PG-2 are inactive, the write port 12 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the semiconductor device 10, or, a write cycle is performed changing the stored data at the storage nodes.

The read port 14 includes a read port pull down transistor RPD and a read port pass gate transistor RPG. A read word line (RWL) is provided that is dedicated to "reads" only. The previous word line WWL is a write only word line. A separate read port can reduce the possibility of "read disturbs", because the data stored in the bit cell affected by the read operations; instead, the read pull down transistor RPD is either on or off based on the storage node 103 voltage that is coupled to the gate of the transistor RPD. When the read word line RWL has a positive voltage placed on it, read pass gate transistor RPG turns on and couples the read bit line RBL to the read pull down transistor RPD, and the read port therefore outputs a corresponding data bit on the read bit line RBL. In many applications, SRAM arrays of many bit cells are used that store data or programs for retrieval and use later. The SRAM cells may experience many more read operations than write operations in the same time period. Thus, the read operations can be isolated from the bit cell by the read port circuit 14.

The structure of the semiconductor device 10 in FIG. 1 is described in the context of the 8T-SRAM. One of ordinary skill in the art, however, should understand that features of the various embodiments described herein may be used for forming other types of devices, such as a 10T-SRAM memory device, or memory devices other than SRAMs. Furthermore, embodiments of the present disclosure may be used as stand-alone memory devices, memory devices integrated with other integrated circuitry, or the like. Accordingly, the embodiments discussed herein are illustrative of specific ways to make and use the disclosure, and do not limit the scope of the disclosure.

Figure 2A:
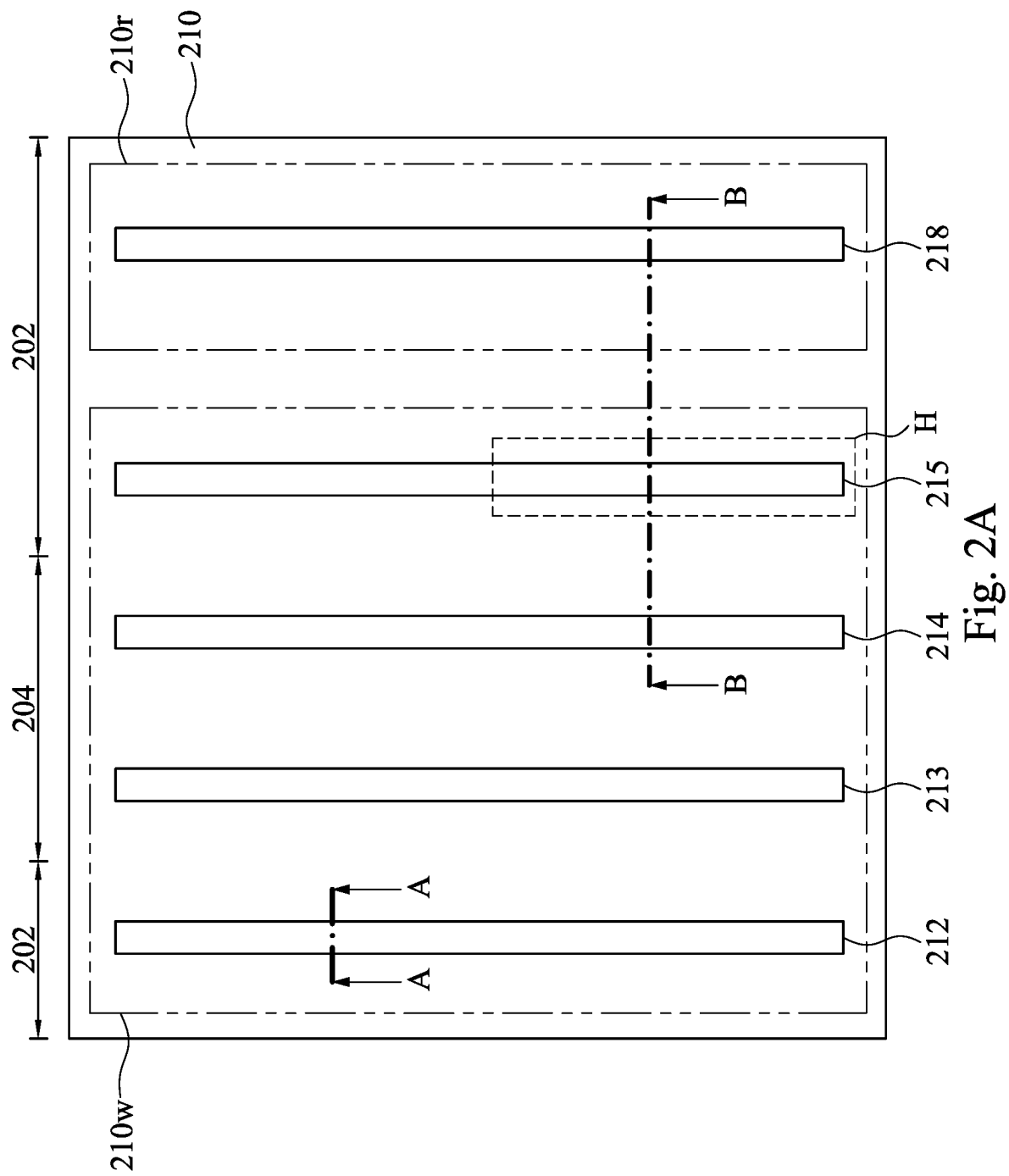
Figure 2B:
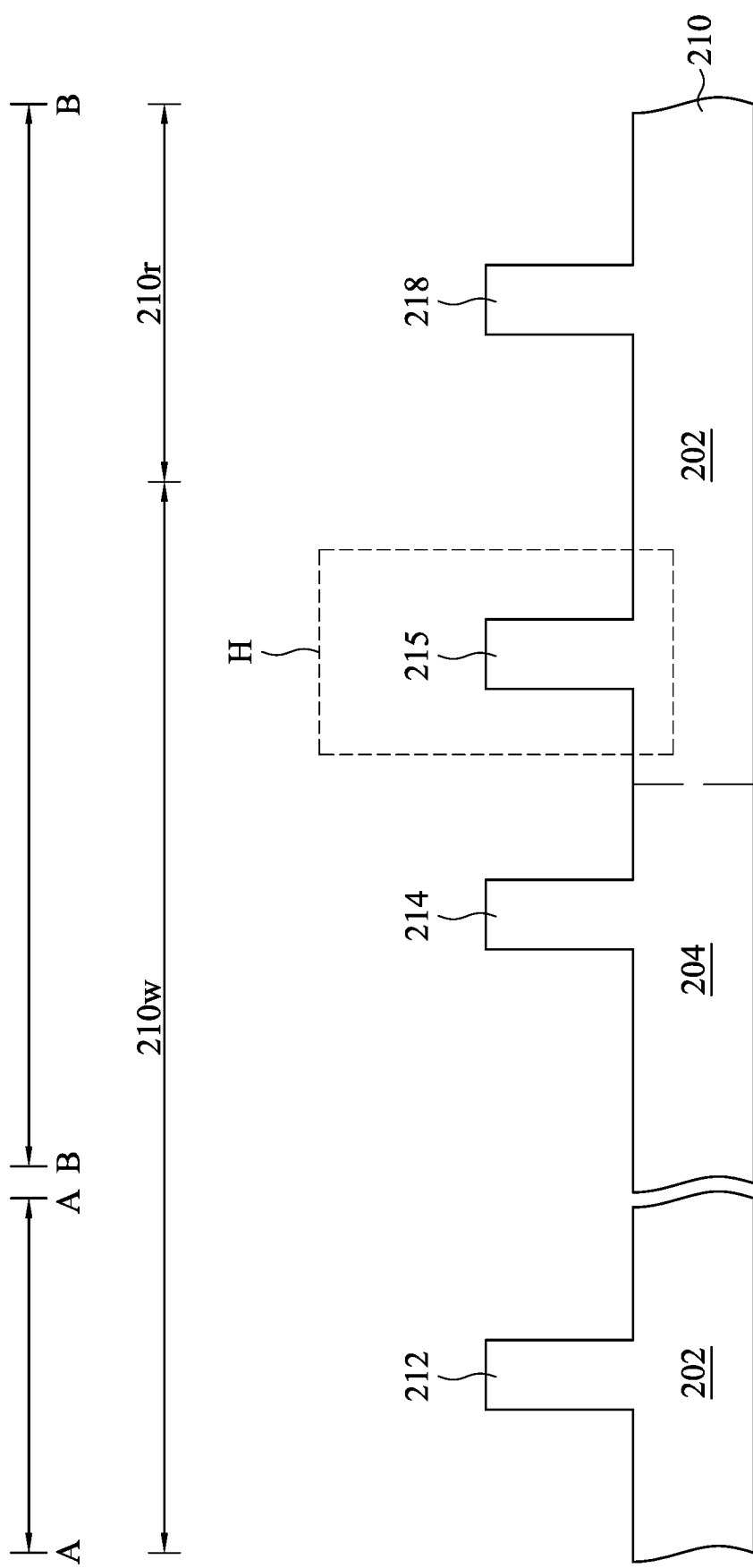

FIGS. 2A to 8A are top views of a method for manufacturing a semiconductor device at various stages in accordance with some embodiments of the present disclosure, and FIGS. 2B to 8B are cross-sectional views taken along lines A-A and B-B of FIGS. 2A to 8A. Reference is made to FIGS. 2A and 2B. A substrate 210 is provided. The substrate 210 has a write portion 210w and a read portion 210r adjacent to the write portion 210w. The substrate 210 further includes a plurality of semiconductor fins 212-215 and 218 protruded from the substrate 210. The semiconductor fins 212-215 are disposed in the write portion 210w of the substrate 210, and the semiconductor fin 218 is disposed in the read portion 210r of the substrate 210. Further, the write portion 210w has a heavy doping area H, and a portion of the semiconductor fin 215 is disposed in the heavy doping area H. The semiconductor fins 212-215 and 218 serves as active regions of transistors (see FIGS. 8A and 13A). It is note that the numbers of the semiconductor fins 212-215 and 218 in FIG. 2A are illustrative, and should not limit the claimed scope of the present disclosure. A person having ordinary skill in the art may select suitable numbers for the semiconductor fins 212-215 and 218 according to actual situations.

In some embodiments, the substrate 210 includes silicon. Alternatively, the substrate 210 may include germanium, silicon germanium, gallium arsenide or other appropriate semiconductor materials. Also alternatively, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 210 may include a semiconductor-on-insulator (SOI) structure. Also alternatively, the substrate 210 may include a buried dielectric layer, such as a buried oxide (BOX) layer, such as that formed by separation by implantation of oxygen (SIMOX) technology, wafer bonding, SEG, or other appropriate method.

At least one first well 202 and at least one second well 204 are formed in the substrate 210. For example, in FIG. 2A, the second well 204 is formed between two of the first wells 202. In some embodiments, the first wells 202 are p-well region, and the second well 204 is an n-well region, and the claimed scope is not limited in this respect. In some embodiments, the first wells 202 are implanted with P dopant material, such as arsenic ions, and the second well 204 is implanted with N dopant material such as boron ions. During the implantation of the first wells 202, the second well 204 is covered with masks (such as photoresist), and during implantation of the second well 204, the first wells 202 are covered with masks (such as photoresist). [NOTE: please check if the highlight description is correct.

The semiconductor fins 212, 213, 214, 215, and 218 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 212-215 and 218 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 212-215 and 218 may be epitaxially grown. For example, exposed portions of an underlying material, such as an exposed portion of the substrate 210, may be used in an epitaxial process to form the semiconductor fins 212-215 and 218. A mask may be used to control the shape of the semiconductor fins 212-215 and 218 during the epitaxial growth process.

Figure 3B:
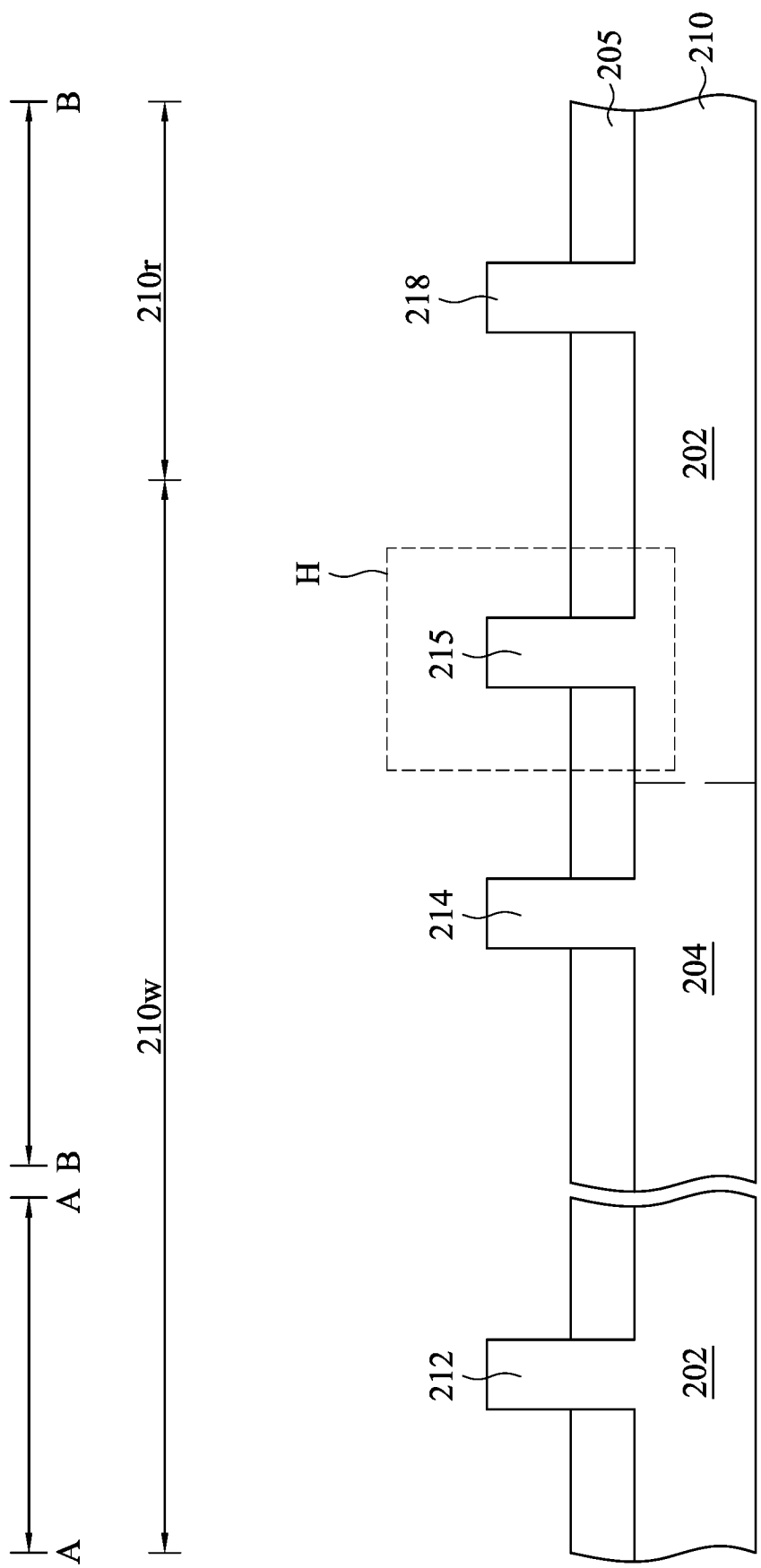

Reference is made to FIGS. 3A and 3B. Portions of the semiconductor fins 213 and 214 are removed. For example, a photomask (not shown) containing patterns for both the semiconductor fins 213 and 214 are used to protect portions of the semiconductor fins 213 and 214 to be kept. Exposed portions of both the semiconductor fins 213 and 214 are then etched at the same time.

Subsequently, a plurality of isolation structures 205 are formed on the substrate 210. The isolation structures 205, which act as shallow trench isolations (STIs) around the semiconductor fins 212-215 and 218, may be formed by chemical vapor deposition (CVD) techniques using tetra-ethyl-ortho-silicate (TEOS) and oxygen as a precursor. In some other embodiments, the isolation structures 205 may be formed by implanting ions, such as oxygen, nitrogen, carbon, or the like, into the substrate 210. In yet some other embodiments, the isolation structures 205 are insulator layers of a SOI wafer.

Figure 4B:
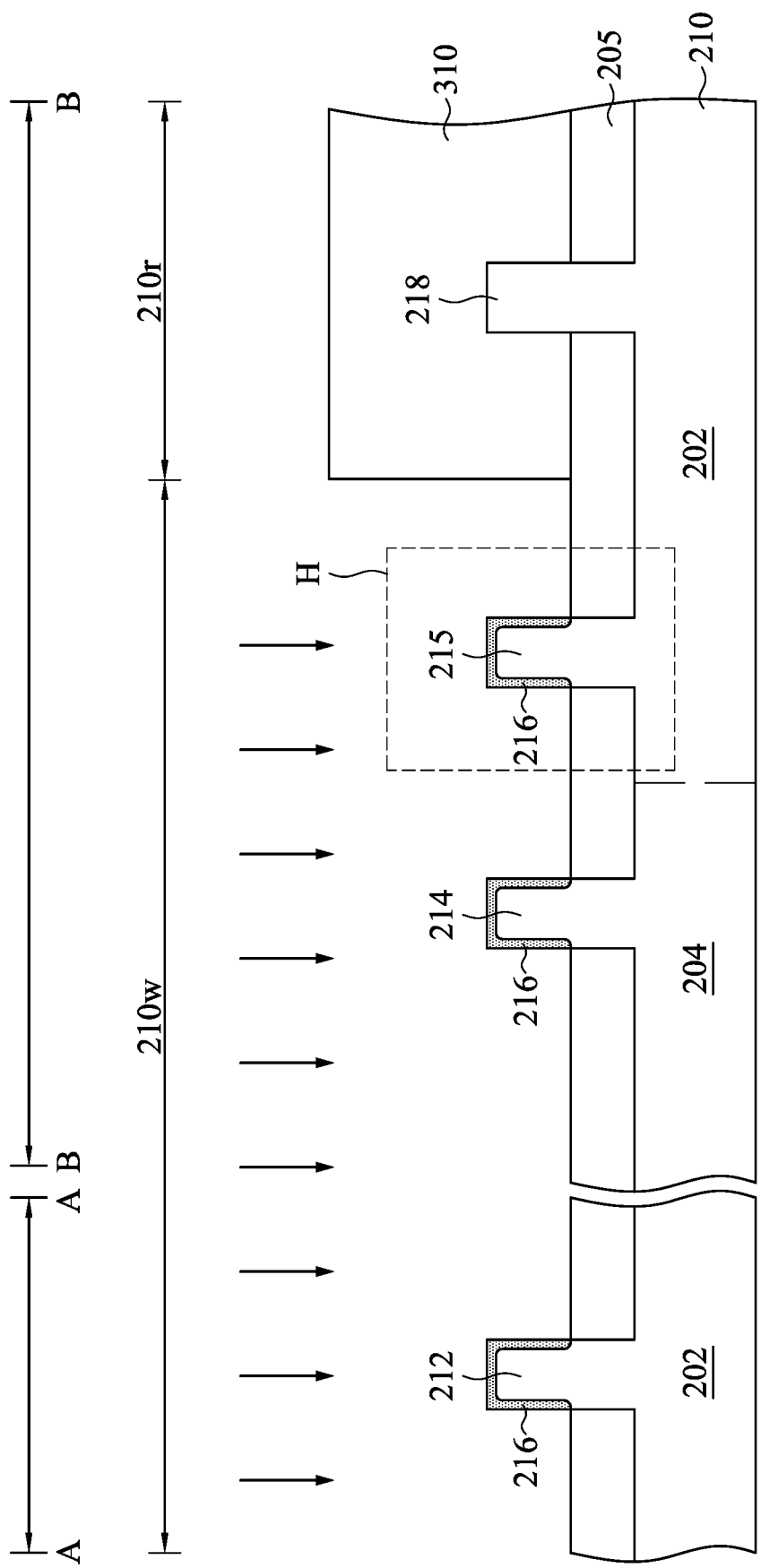

Reference is made to FIGS. 4A and 4B. A mask 310 is formed on the read port 210r of the substrate 210. That is, the mask 310 covers the semiconductor fin 218 while leaves the semiconductor fins 212-215 uncovered. Then, a channel doping process is performed to form channel doping layers 216 respectively in the semiconductor fins 212-215. In some embodiments, N dopants or P dopants such as arsenic (As) or boron (B) can be doped into the semiconductor fins 212-215 to form the channel doping layers 216. In some embodiments, the implantation results in a surface layer of the semiconductor fins 212-215 to be doped, wherein the surface layer includes the top surface layer and the opposite sidewall surface layers of the semiconductor fins 212-215. The inner portions of the semiconductor fins 212-215 wrapped by the channel doping layers 216, however, may be free from the dopants. In alternative embodiments, the implantation results in an entirety of semiconductor fins 212-215 to be doped with the dopants.

Figure 5A:
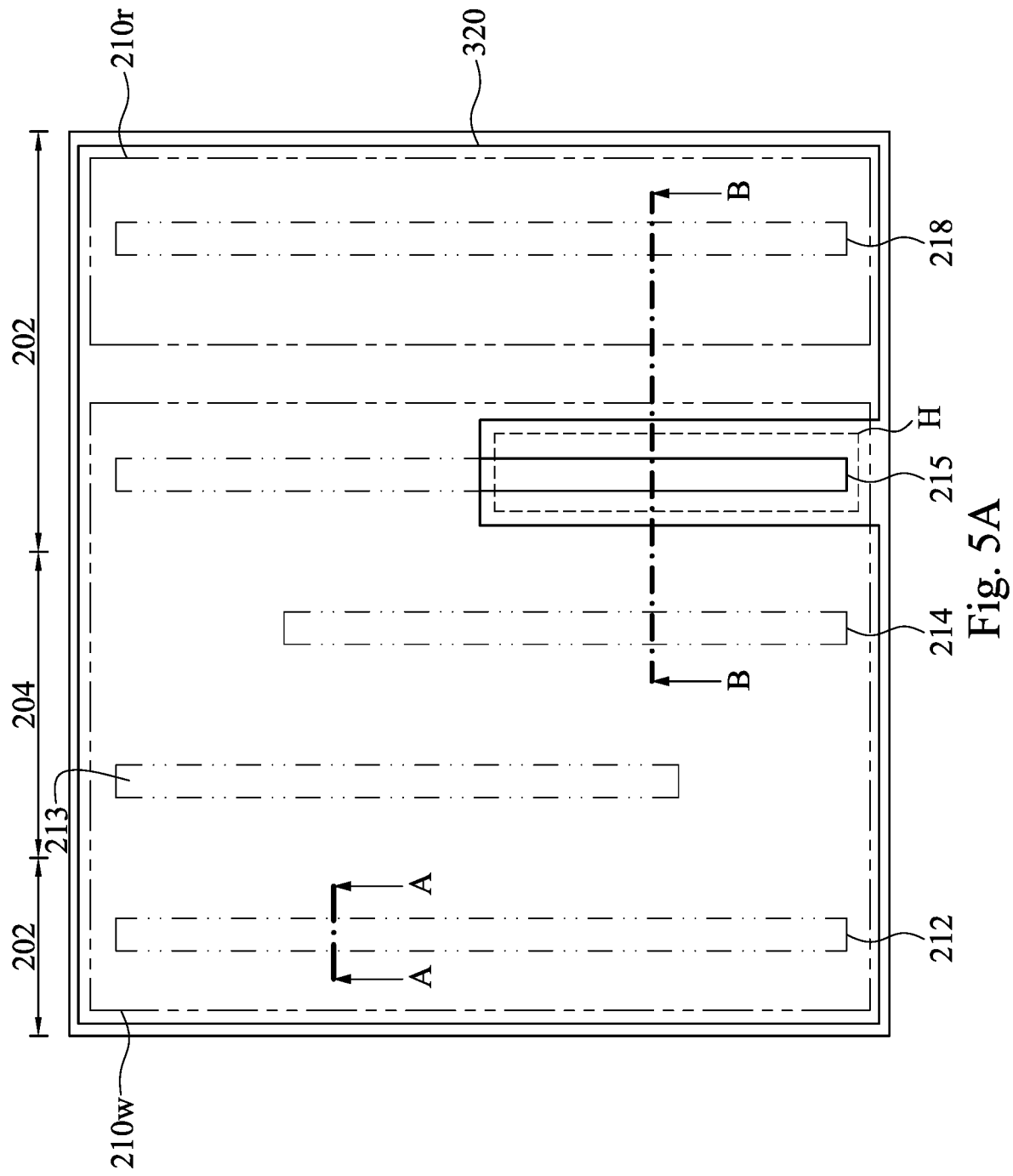
Figure 5B:
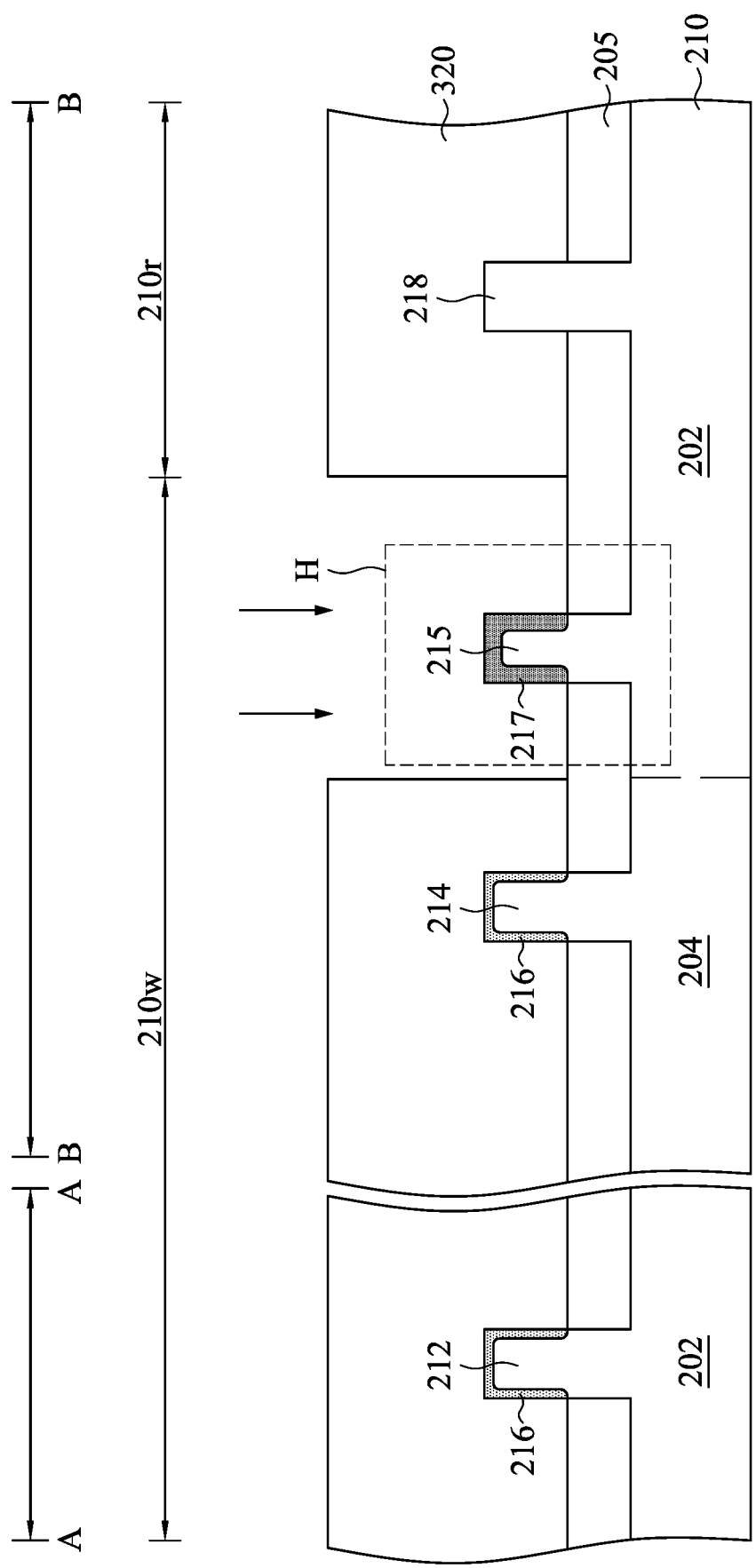

Reference is made to FIGS. 5A and 5B. The mask 310 of FIGS. 4A and 4B is removed. In some embodiments, another mask 320 is formed on the substrate 210. The mask 320 covers the write portion 210w and the read portion 210r except the heavy doping area H. In other words, the mask 320 exposes the heavy doping area H. Then, another channel doping process is performed to form a channel doping layer 217 in the portion of the semiconductor fin 215 in the heavy doping area H. In some embodiments, N dopants or P dopants such as arsenic (As) or boron (B) can be doped into the semiconductor fin 215 to form the channel doping layer 217. In some embodiments, the implantation results in a surface layer of the semiconductor fin 215 to be doped, wherein the surface layer includes the top surface layer and the opposite sidewall surface layers of the semiconductor fin 215. The inner portions of the semiconductor fin 215 wrapped by the channel doping layer 217, however, may be free from the dopants. In alternative embodiments, the implantation results in an entirety of semiconductor fin 215 to be doped with dopants. After the process of FIGS. 5A and 5B, the doping concentration of the channel doping layer 217 is higher than the doping concentration of the channel doping layer 216.

The implantation process of FIGS. 4A-5B is illustrative. In some other embodiments, the channel doping layers 216 and 217 may be formed separately. For example, a mask can be formed to cover the read portion 210r and the heavy doping area H, and the exposed semiconductor fins 212-215 are doped to respectively form the channel doping layers 216 therein. The mask is then removed, and the mask 320 of FIG. 5A is formed on the substrate 210. The portion of the semiconductor fin 215 in the heavy doping area H is then doped to form the channel doping layer 217 therein. In some other embodiments, the process of FIGS. 5A and 5B can be omitted. That is, the semiconductor fins 212-215 respectively include the channel doping layers 216.

Figure 6A:
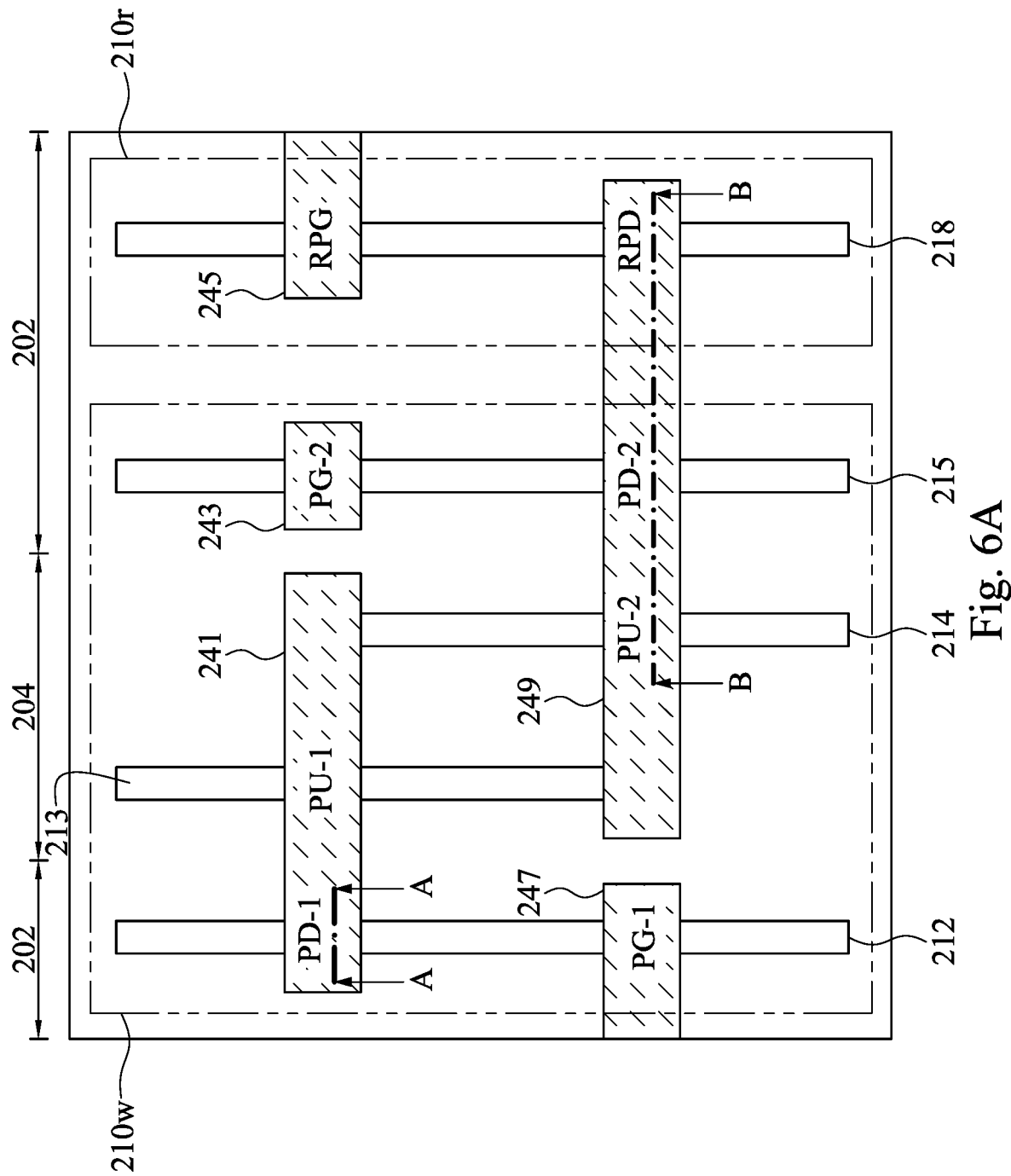
Figure 6B:
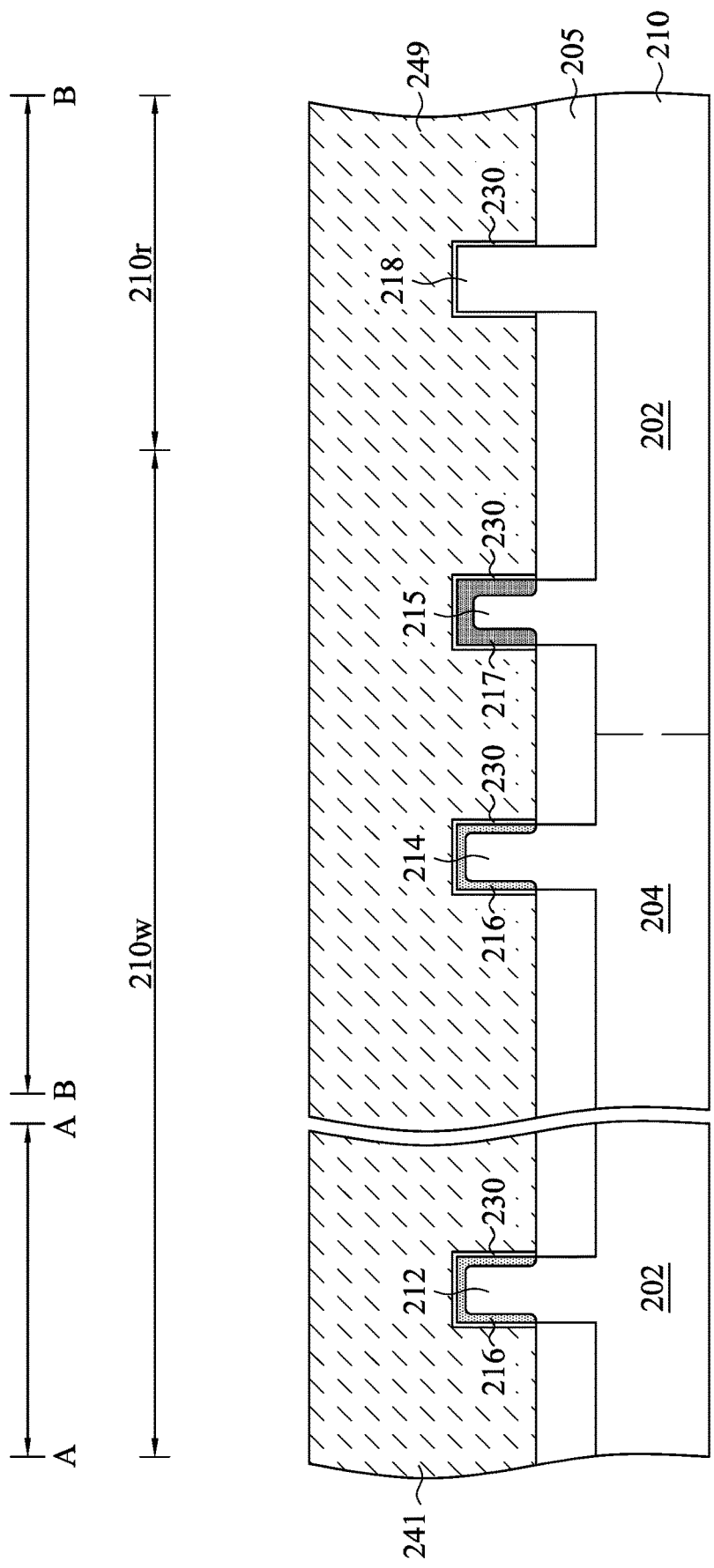

Reference is made to FIGS. 6A and 6B. A plurality of gate dielectrics 230 are formed on the semiconductor fins 212-215 and 218. For clarity, the gate dielectrics 230 are illustrated in FIG. 6B and are omitted in FIG. 6A. The gate dielectrics 230, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectrics 230 may have a multilayer structure such as one layer of silicon oxide (e.g., interfacial layer) and another layer of high-k material. The gate dielectrics 230 may be formed using chemical vapor deposition (CVD), physical vapor deposition (PVD), atomic layer deposition (ALD), thermal oxide, ozone oxidation, other suitable processes, or combinations thereof.

A plurality of dummy gates 241, 243, 245, 247, and 249 are then formed on portions of the semiconductor fins 212-215 and 218 and expose another portions of the semiconductor fins 212-215 and 218. The dummy gates 241, 243, 245, 247, and 249 are formed over the substrate 210 to cover the gate dielectrics 230 and the portions of the semiconductor fins 212-215 and 218. As shown in FIG. 6B, the gate dielectrics 230 are disposed between the dummy gates 241, 243, 245, 247, and 249 and the semiconductor fins 212-215 and 218. In greater detail, the dummy gate 241 is formed on portions of the semiconductor fins 212 and 213, and further on a portion of the semiconductor fin 214 in some embodiments (as shown in FIG. 6A); the dummy gate 243 is formed on a portion of the semiconductor fin 215; the dummy gate 245 is formed on a portion of the semiconductor fin 218, the dummy gate 247 is formed on another portion of the semiconductor fin 212, and the dummy gate 249 is formed on portions of the semiconductor fins 214, 215, and 218, and further on another portion of the semiconductor fin 213 in some embodiments (as shown in FIG. 6A).

In some embodiments, the dummy gates 241, 243, 245, 247, and 249 includes a semiconductor material such as polysilicon, amorphous silicon, or the like. The dummy gates 241, 243, 245, 247, and 249 may be deposited doped or undoped. For example, in some embodiments, the dummy gates 241, 243, 245, 247, and 249 includes polysilicon deposited undoped by low-pressure chemical vapor deposition (LPCVD). The polysilicon may also be deposited, for example, by furnace deposition of an in-situ doped polysilicon.

A plurality of gate spacers (not shown) are formed over the substrate 210 and along the sides of the dummy gates 241, 243, 245, 247, and 249. In some embodiments, the gate spacers may include silicon oxide, silicon nitride, silicon oxy-nitride, or other suitable material. The gate spacers may include a single layer or multilayer structure. A blanket layer of the gate spacers may be formed by CVD, PVD, ALD, or other suitable technique. Then, an anisotropic etching is performed on the blanket layer to form a pair of the gate spacers on two sides of the dummy gates 241, 243, 245, 247, and 249.

In FIG. 6A, the semiconductor fin 212 and the dummy gate 241 form a pull-down transistor PD-1, and the semiconductor fin 213 and the dummy gate 241 form a pull-up transistor PU-1. In other words, the pull-down transistor PD-1 and the pull-up transistor PU-1 share the dummy gate 241. The semiconductor fin 215 and the dummy gate 243 form a pass-gate transistor PG-2. The semiconductor fin 218 and the dummy gate 245 form a read-pass-gate transistor RPG. The semiconductor fin 212 and the dummy gate 247 form another pass-gate transistor PG-1. The semiconductor fin 214 and the dummy gate 249 form another pull-up transistor PU-2, the semiconductor fin 215 and the dummy gate 249 form another pull-down transistor PD-2, and the semiconductor fin 218 and the dummy gate 249 form a read-pull-down transistor RPD. In other words, the pull-up transistor PU-2, the pull-down transistor PD-2 and the read-pull-down transistor RPD share the dummy gate 249. Therefore, the transistors in the write portion 210w (i.e., transistors PD-1, PD-2, PU-1, PU-2, PG-1, and PG-2) form a six-transistor (6T) SRAM, and the semiconductor device in FIG. 6A is an 8T-SRAM device. One of ordinary skill in the art, however, should understand that features of the various embodiments described herein may be used for forming other types of devices, such as a 10T-SRAM device or other integrated circuits.

Figure 7A:
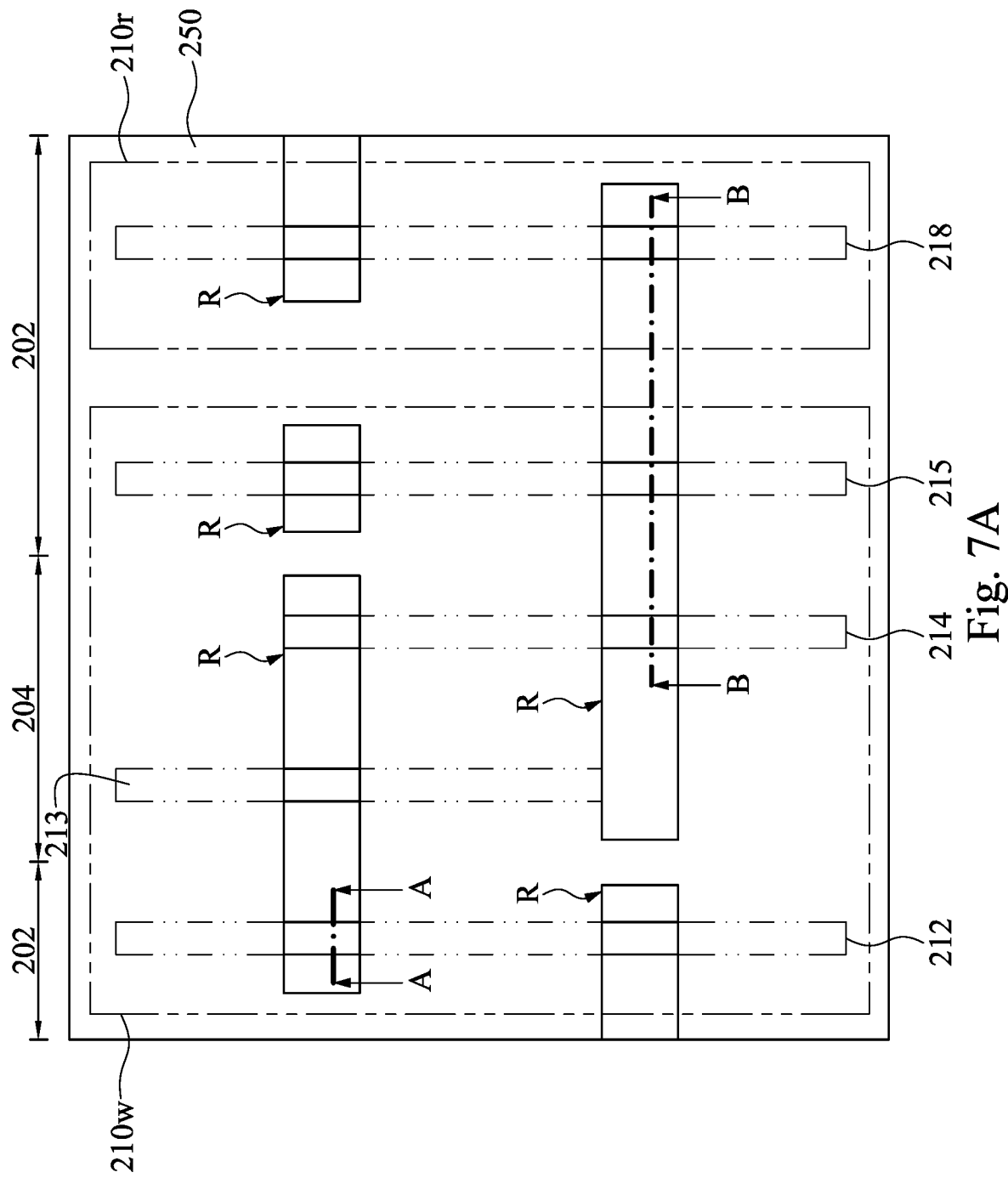
Figure 7B:
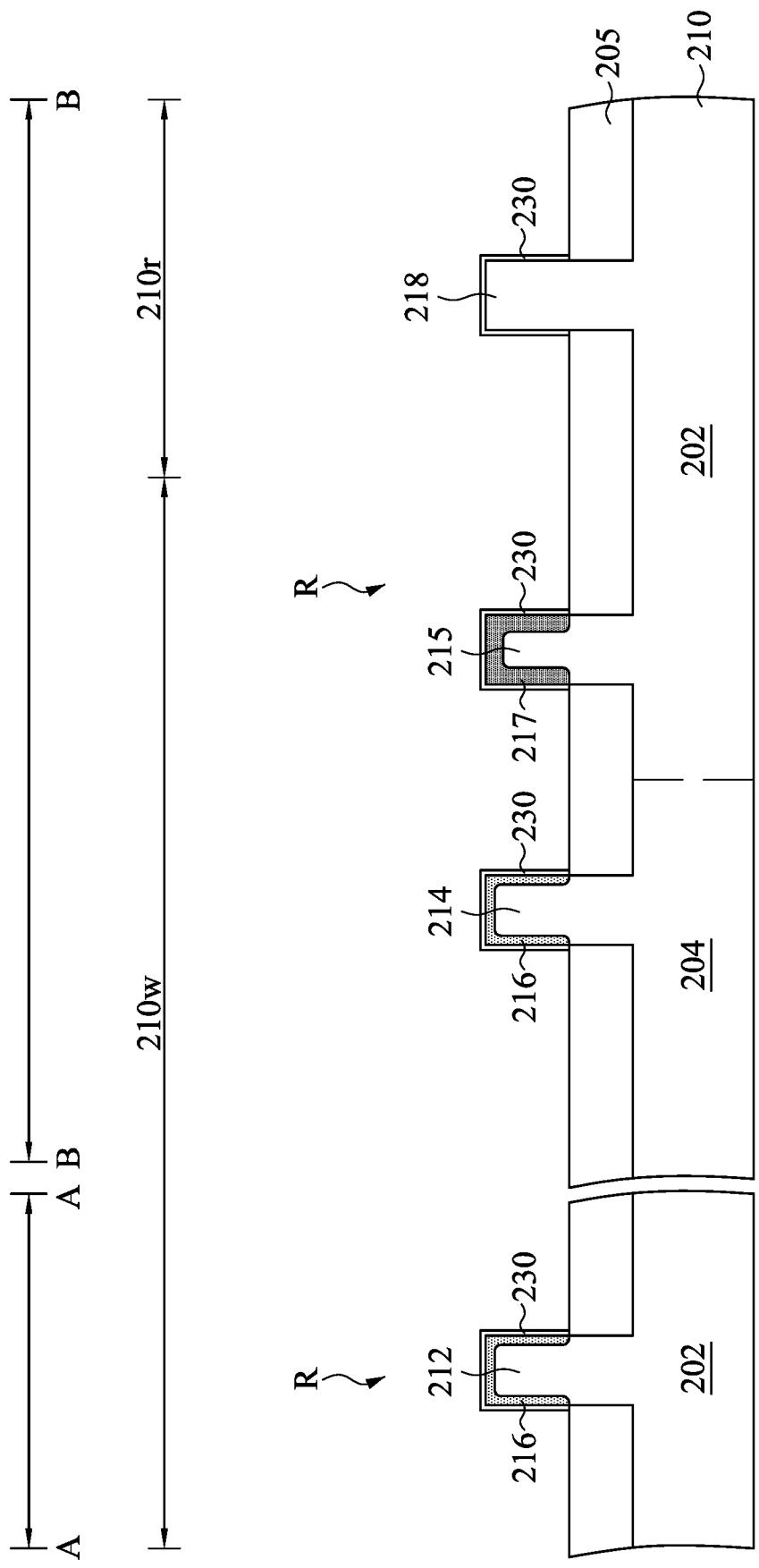

Reference is made to FIGS. 7A and 7B. A dielectric layer 250 is formed at outer sides of the gate spacers on the substrate 210. The dielectric layer 250 includes silicon oxide, oxynitride or other suitable materials. The dielectric layer 250 may include a single layer or multiple layers. The dielectric layer 250 is formed by a suitable technique, such as CVD or ALD. A chemical mechanical planarization (CMP) process may be applied to remove excessive dielectric layer 250 and expose the top surface of the dummy gates 241, 243, 245, 247, and 249 to a subsequent dummy gate removing process.

A replacement gate (RPG) process scheme is employed. In some embodiments, in a RPG process scheme, a dummy polysilicon gate is formed first and is replaced later by a metal gate after high thermal budget processes are performed. In some embodiments, the dummy gates 241, 243, 245, 247, and 249 (see FIG. 6A) are removed to form recesses R with the gate spacers and the dielectric layer 250 as its sidewalls. In some embodiments, the dummy gates 241, 243, 245, 247, and 249 are removed while the gate dielectric 230 retains. The dummy gates 241, 243, 245, 247, and 249 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 8A:
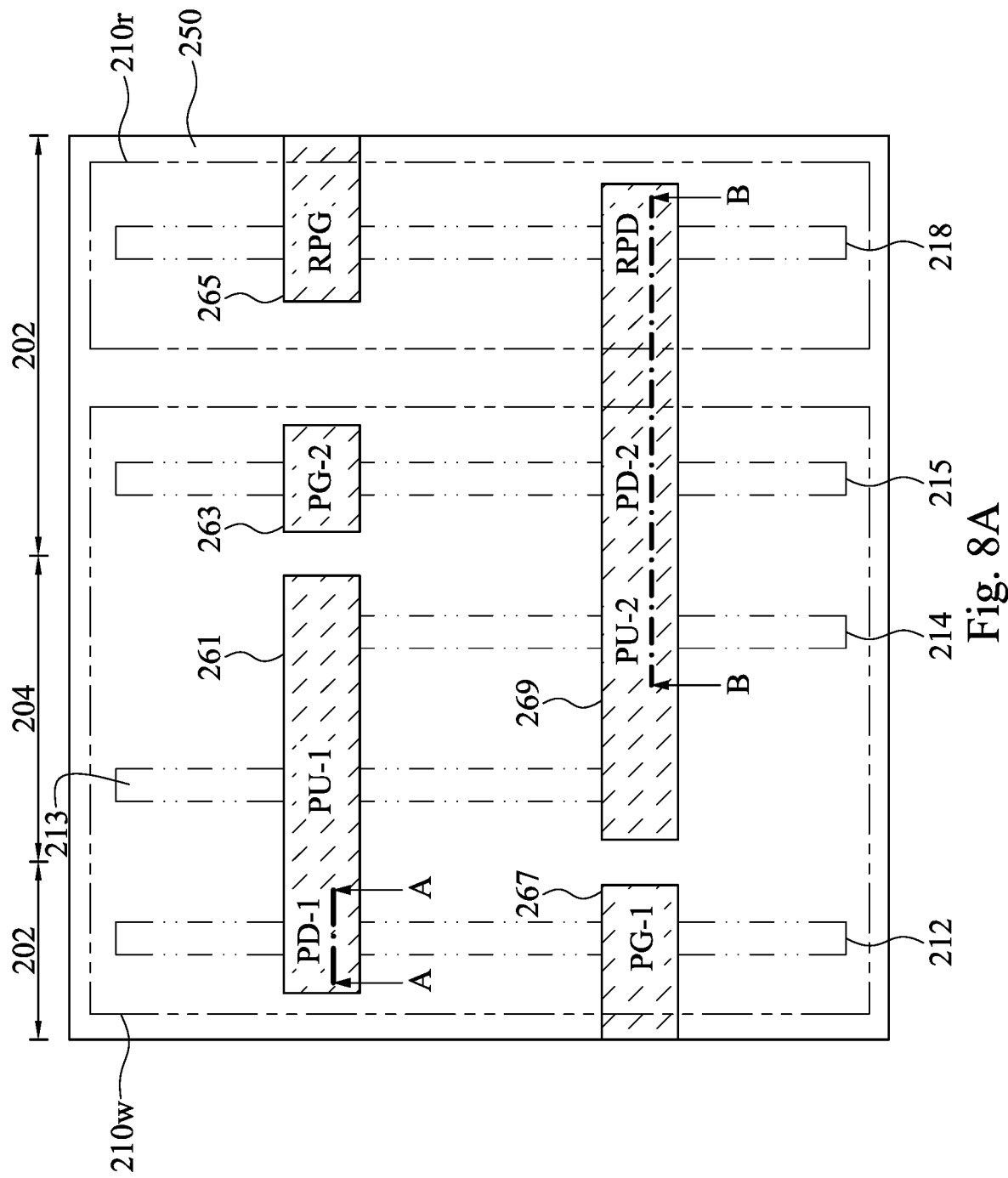
Figure 8B:
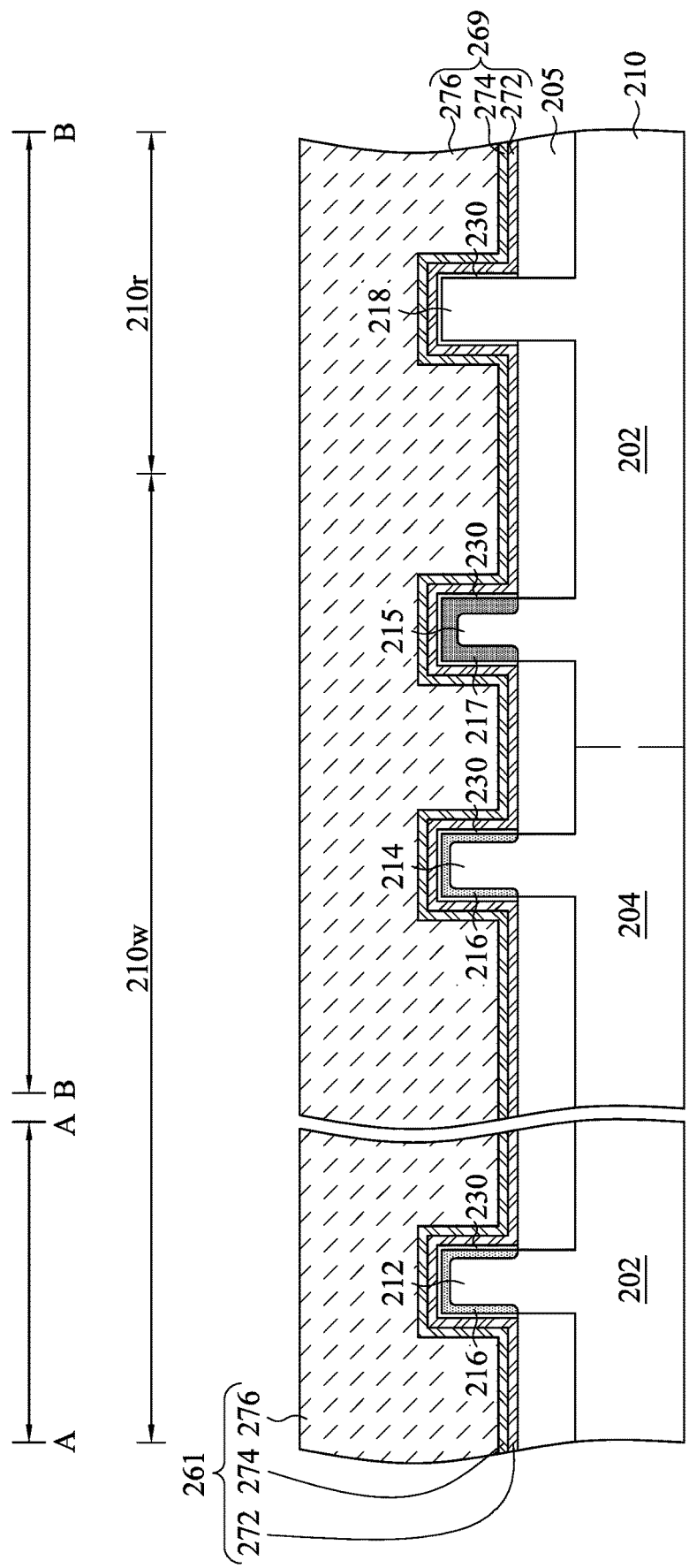

Reference is made to FIGS. 8A and 8B. A plurality of metal gates 261, 263, 265, 267, and 269 are respectively formed in the recesses R. In greater detail, a gate dielectric layer 272 is formed on the substrate 210 and in the recesses R. The gate dielectric layer 272 may be a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof; or other suitable material. The gate dielectric layer 272 may be formed by atomic layer deposition (ALD) and/or other suitable methods.

A work function metal layer 274 is then formed on the gate dielectric layer 272. In some embodiments, the work function metal layer 274 may include a single layer or multi layers, such as a work function film, a liner film, a wetting film, and an adhesion film. The work function metal layer 274 may include Ti, TiAl, TiAlN, TaC, TaCN, TaSiN, Mn, Zr, TiN, TaN, Ru, Mo, WN, Co, Al, or any suitable materials. For example, the work function metal layer 274 includes at least one of Ti, Al, or TiAl when the metal gate is part of an N-channel transistor. Alternatively, the work function metal layer 274 includes at least one of TiN, Co, WN, or TaC when the metal gate is part of a P-channel transistor. The work function metal layer 274 may be formed by ALD, PVD, CVD, or other suitable process.

The remaining recesses R are filled with a metal layer 276 on the work function metal layer 274. In some embodiments, the metal layer 276 includes tungsten (W). The metal layer 276 is deposited by ALD, PVD, CVD, or other suitable process. In some other embodiments, the metal layers 276 include aluminum (Al), copper (Cu) or other suitable conductive material. After forming the gate dielectric layer 272, the metal layer 274 and the metal layer 276, a planarization process may be performed to remove the metal gate layers from the surface of the dielectric layer 250.

In FIG. 8A, the semiconductor fin 212 and the metal gate 261 form a pull-down transistor PD-1, and the semiconductor fin 213 and the metal gate 261 form a pull-up transistor PU-1. In other words, the pull-down transistor PD-1 and the pull-up transistor PU-1 share the metal gate 261. The semiconductor fin 215 and the metal gate 263 form a pass-gate transistor PG-2. The semiconductor fin 218 and the metal gate 265 form a read-pass-gate transistor RPG. The semiconductor fin 212 and the metal gate 267 form another pass-gate transistor PG-1. The semiconductor fin 214 and the metal gate 269 form another pull-up transistor PU-2, the semiconductor fin 215 and the metal gate 269 form another pull-down transistor PD-2, and the semiconductor fin 218 and the metal gate 269 form a read-pull-down transistor RPD. In other words, the pull-up transistor PU-2, the pull-down transistor PD-2 and the read-pull-down transistor RPD share the metal gate 269. Therefore, the transistors in the write portion 210w (i.e., transistors PD-1, PD-2, PU-1, PU-2, PG-1, and PG-2) form a six-transistor (6T) SRAM, and the semiconductor device in FIG. 8A is an 8T-SRAM device. One of ordinary skill in the art, however, should understand that features of the various embodiments described herein may be used for forming other types of devices, such as a 10T-SRAM device or other integrated circuits.

In FIGS. 8A and 8B, the transistors PD-2 and RPD share the same metal gate 269. That is, the gate of the transistor PD-2 and the gate of the transistor RPD are integrally formed and thus have the substantially the same configuration. For example, a portion of the work function layer 274 disposed on the semiconductor fin 215 of the transistor PD-2 has a thickness substantially the same as a thickness of another portion of the work function layer 274 disposed on the semiconductor fin 218 of the transistor RPD. The term "substantially" as used herein may be applied to modify any quantitative representation which could permissibly vary without resulting in a change in the basic function to which it is related. The threshold voltages of the transistors PD-2 and RPD are tuned by the doping process shown in FIGS. 4A and 4B (and FIGS. 5A and 5B). Since the transistor PD-2 includes the channel doping layer 217, the threshold voltage of the transistor PD-2 is raised, such that the threshold voltage of the transistor PD-2 is higher than the threshold voltage of the transistor RPD although they share the same metal gate 269. Furthermore, since the transistor RPD is non-doped in FIG. 8B, the channel of the transistor RPD does not have a doping damage, and the device performance of the transistor RPD is improved to allow rapid reading speed.

Moreover, the four transistors PU-1, PU-2, PD-1, and PD-2 form two cross-coupled inverters, such that the threshold voltages of the transistors PD-1 and PD-2 can be the same in some embodiments. However, since the transistor PD-2 share the metal gate 269 with the transistor RPD, which has lower threshold voltage than the transistor PD-2, the threshold voltage of the transistor PD-2 may be slightly dropped. To compensate this effect, the channel doping layer 217 of the transistor PD-2 has a doping concentration greater than that of the channel doping layer 216 of the transistor PD-1. As such, the transistors PD-1 and PD-2 can have substantially the same threshold voltage.

Figure 9:
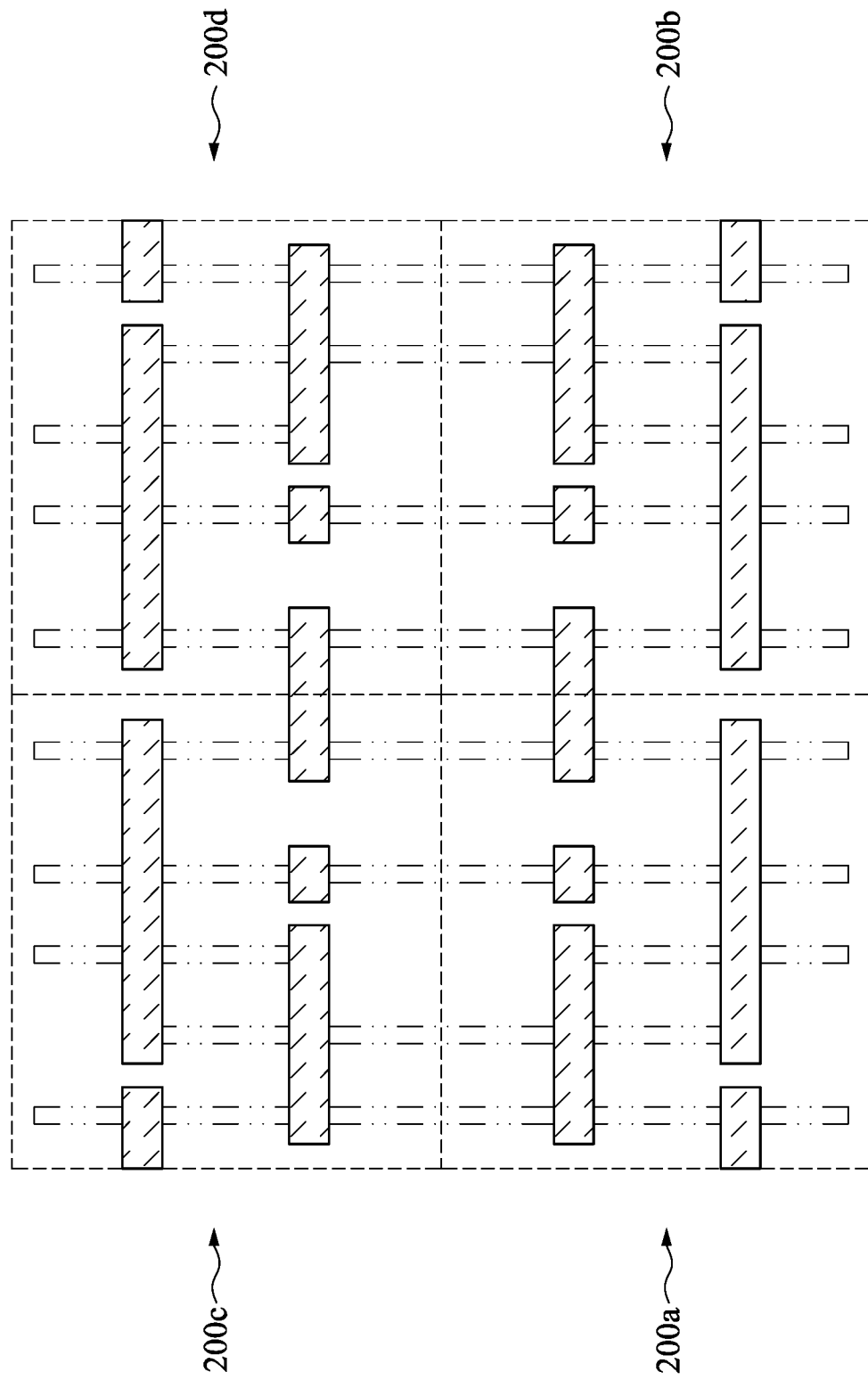
FIG. 9 is a top view of a semiconductor device in accordance with some embodiments of the present disclosure.

FIG. 9 is a top view of a semiconductor device in accordance with some embodiments of the present disclosure. In FIG. 9, the semiconductor device is an SRAM device including four memory cells 200a, 200b, 200c, and 200d. In some other embodiments, however, the number of the memory cells 200a, 200b, 200c, and 200d in the SRAM device is not limited in this respect. The memory cell 200a has substantially the same layout as the semiconductor device in FIG. 8A. In FIG. 9, when the memory cells 200a-200d are arranged together to form an array (an SRAM device herein), the cell layouts may be flipped or rotated to enable higher packing densities. Often by flipping the cell over a cell boundary or axis and placing the flipped cell adjacent the original cell, common nodes and connections can be combined to increase packing density. For example, the memory cells 200a-200d are mirror images and in rotated images of each other. Specifically, the memory cells 200a and 200b are mirror images across a Y-axis, as is the memory cells 200c and 200d. The memory cells 200a and 200c are mirror images across an X-axis, as is the memory cells 200b and 200d. Further, the diagonal memory cells (the memory cells 200a and 200d; the memory cells 200b and 200c) are rotated images of each other at 180 degrees.

Figure 10A:
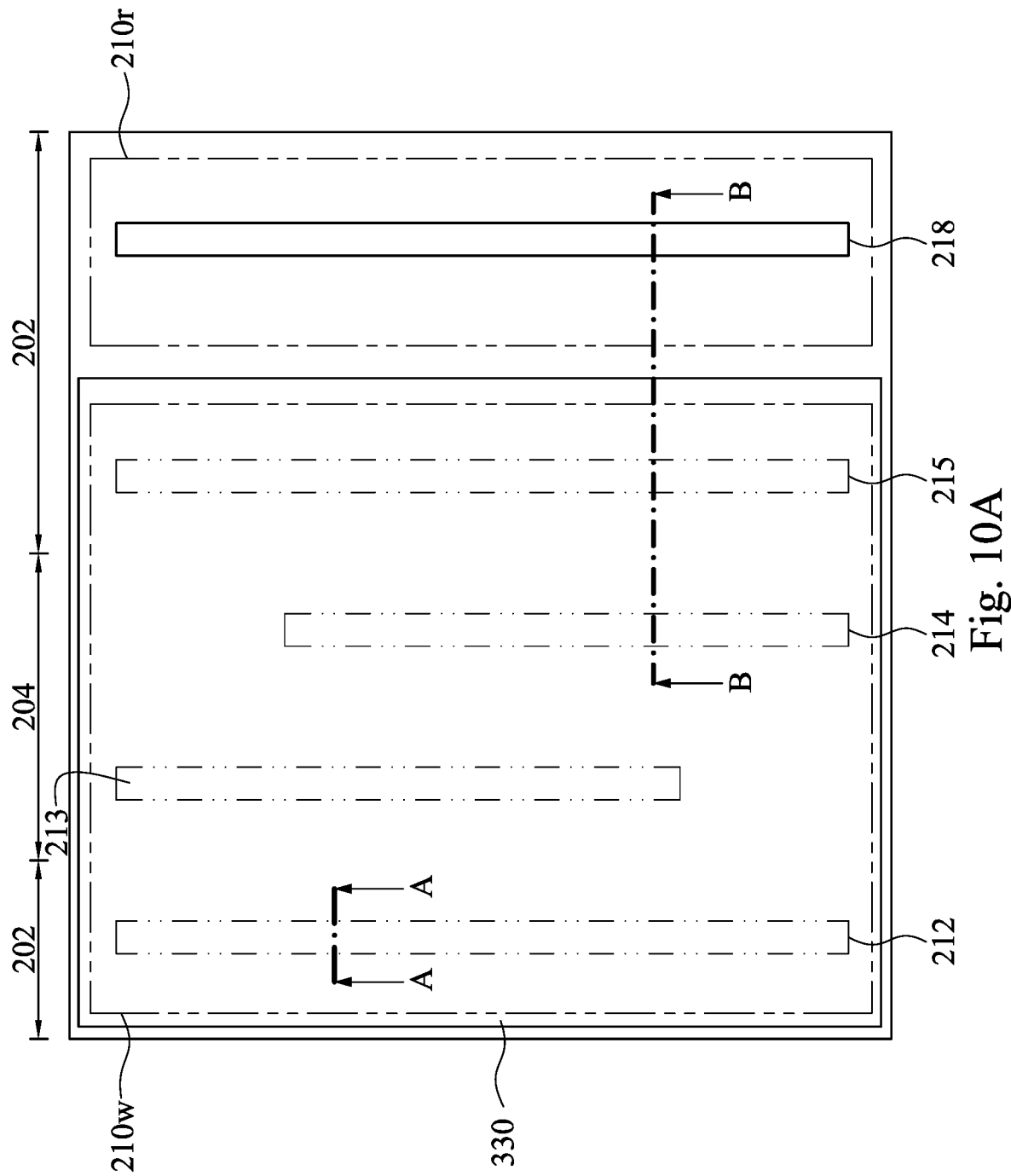
Figure 10B:
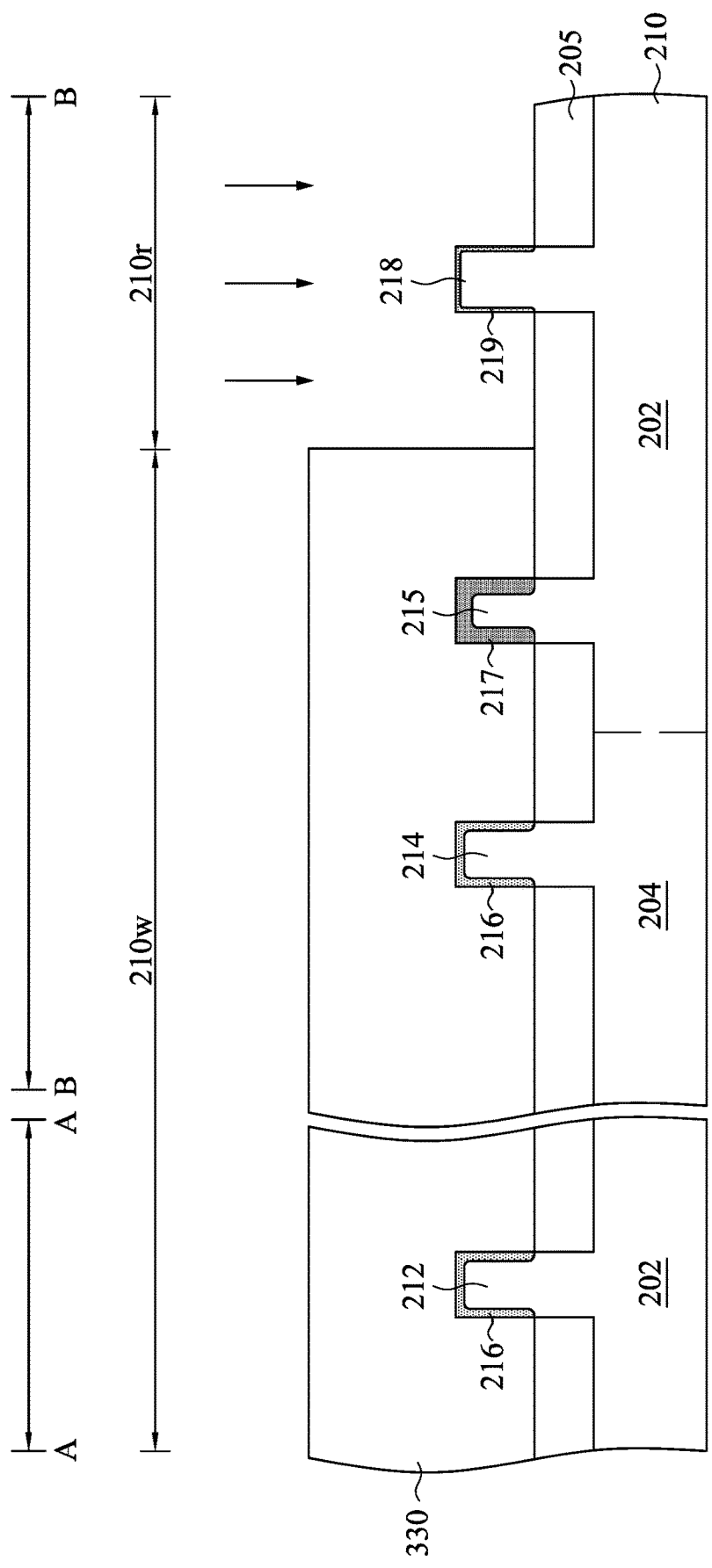

FIGS. 10A to 13A are top views of a method for manufacturing a semiconductor device at various stages in accordance with some embodiments of the present disclosure, and FIGS. 10B to 13B are cross-sectional views taken along lines A-A and B-B of FIGS. 10A to 13A. The manufacturing processes of FIGS. 2A to 5B are performed in advance. Since the relevant manufacturing details are similar to FIGS. 2A to 5B, and, therefore, a description in this regard will not be repeated hereinafter. Reference is made to FIGS. 10A and 10B. The mask 320 of FIGS. 5A and 5B is removed. In some embodiments, still another mask 330 is formed on the substrate 210. The mask 330 covers the write portion 210w and exposes the read portion 210r. Then, still another channel doping process is performed to form a channel doping layer 219 in semiconductor fin 218. In some embodiments, N dopants or P dopants such as arsenic (As) or boron (B) can be doped into the semiconductor fin 218 to form the channel doping layer 219. In some embodiments, the implantation results in a surface layer of the semiconductor fin 218 to be doped, wherein the surface layer includes the top surface layer and the opposite sidewall surface layers of the semiconductor fin 218. The inner portions of the semiconductor fin 218 wrapped by the channel doping layer 219, however, may be free from the dopants. In alternative embodiments, the implantation results in an entirety of semiconductor fin 218 to be doped with the dopants. After the process of FIGS. 10A and 10B, the doping concentration of the channel doping layer 219 is lower than the doping concentration of the channel doping layers 216 and 218.

Figure 11A:
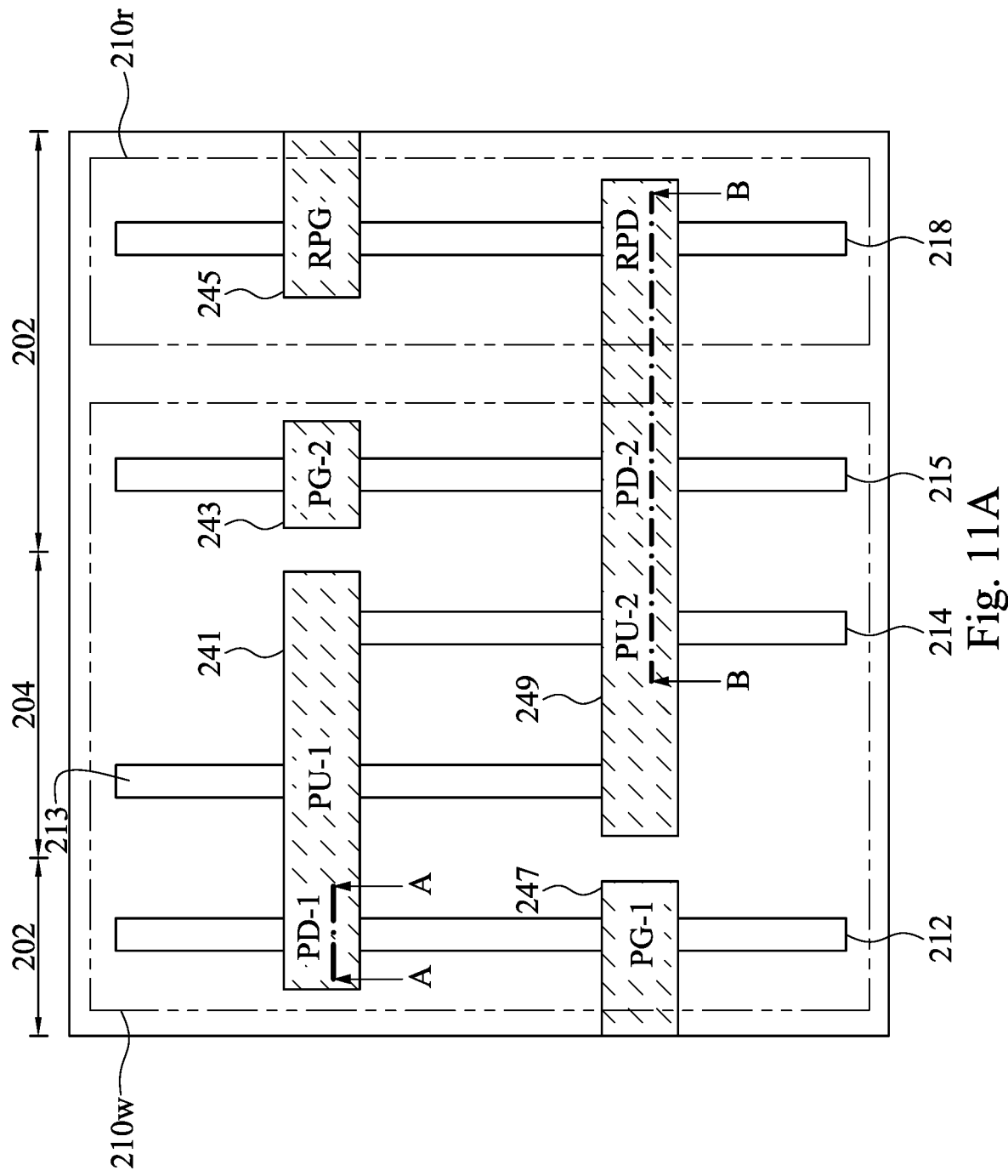
Figure 11B:
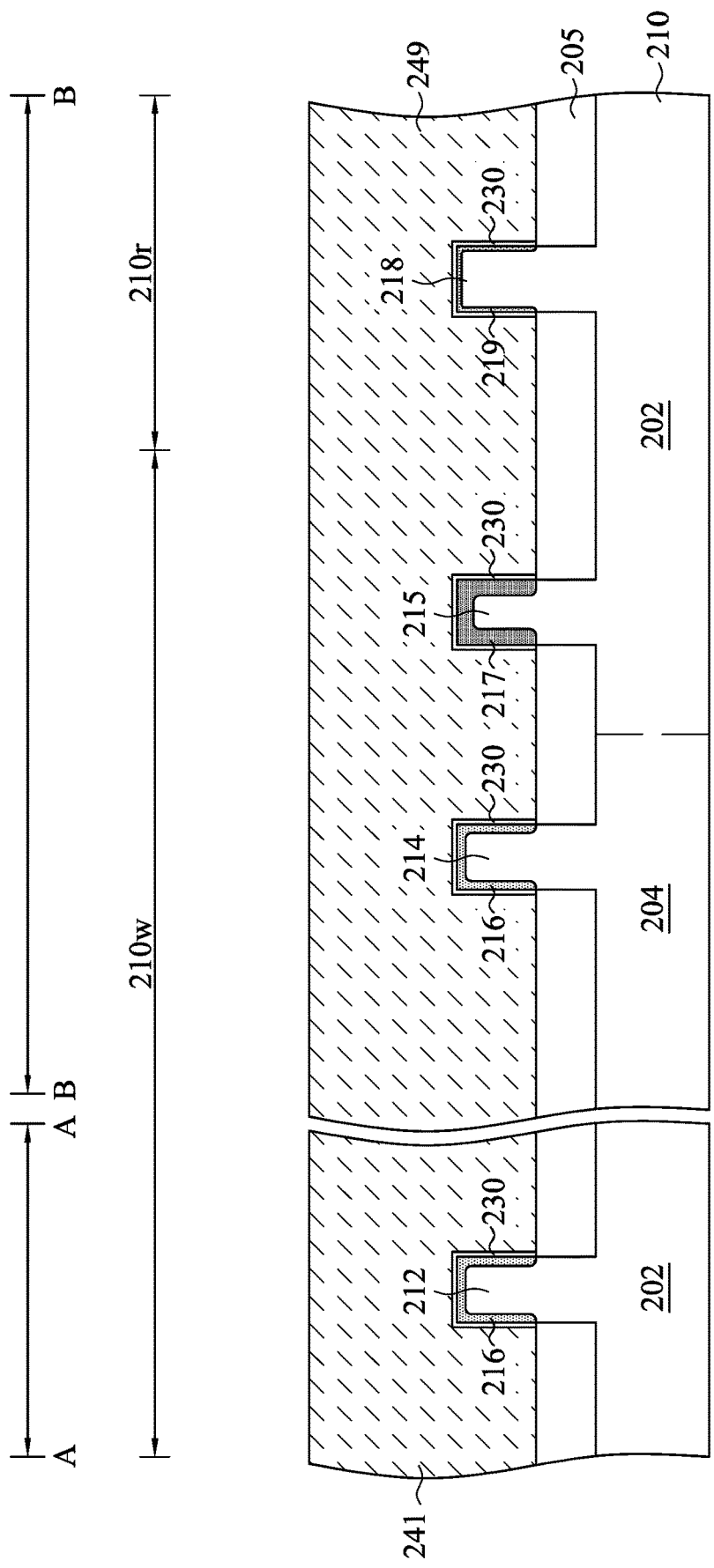

Reference is made to FIGS. 11A and 11B. A plurality of gate dielectrics 230 are formed on the semiconductor fins 212-215 and 218. For clarity, the gate dielectrics 230 are illustrated in FIG. 11B and are omitted in FIG. 11A. The gate dielectrics 230 of FIG. 11B and FIG. 6A may have the same or different material and/or manufacturing processes, and the present disclosure is not limited in this respect. A plurality of dummy gates 241, 243, 245, 247, and 249 are then formed on portions of the semiconductor fins 212-215 and 218 and expose another portions of the semiconductor fins 212-215 and 218. The dummy gates 241, 243, 245, 247, and 249 of FIG. 11A and FIG. 6A may have the same or different material and/or manufacturing processes, and the present disclosure is not limited in this respect.

Figure 12A:
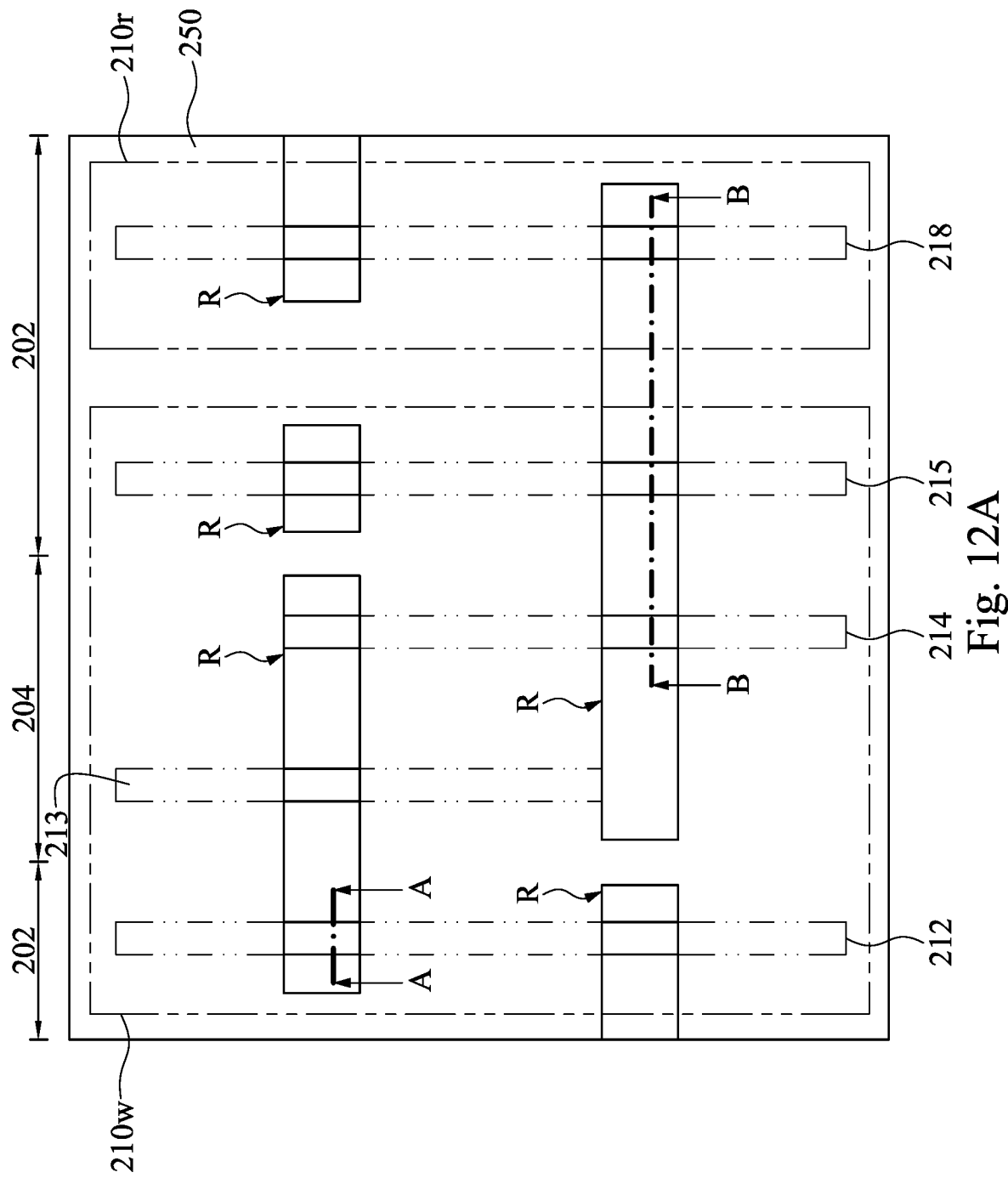
Figure 12B:
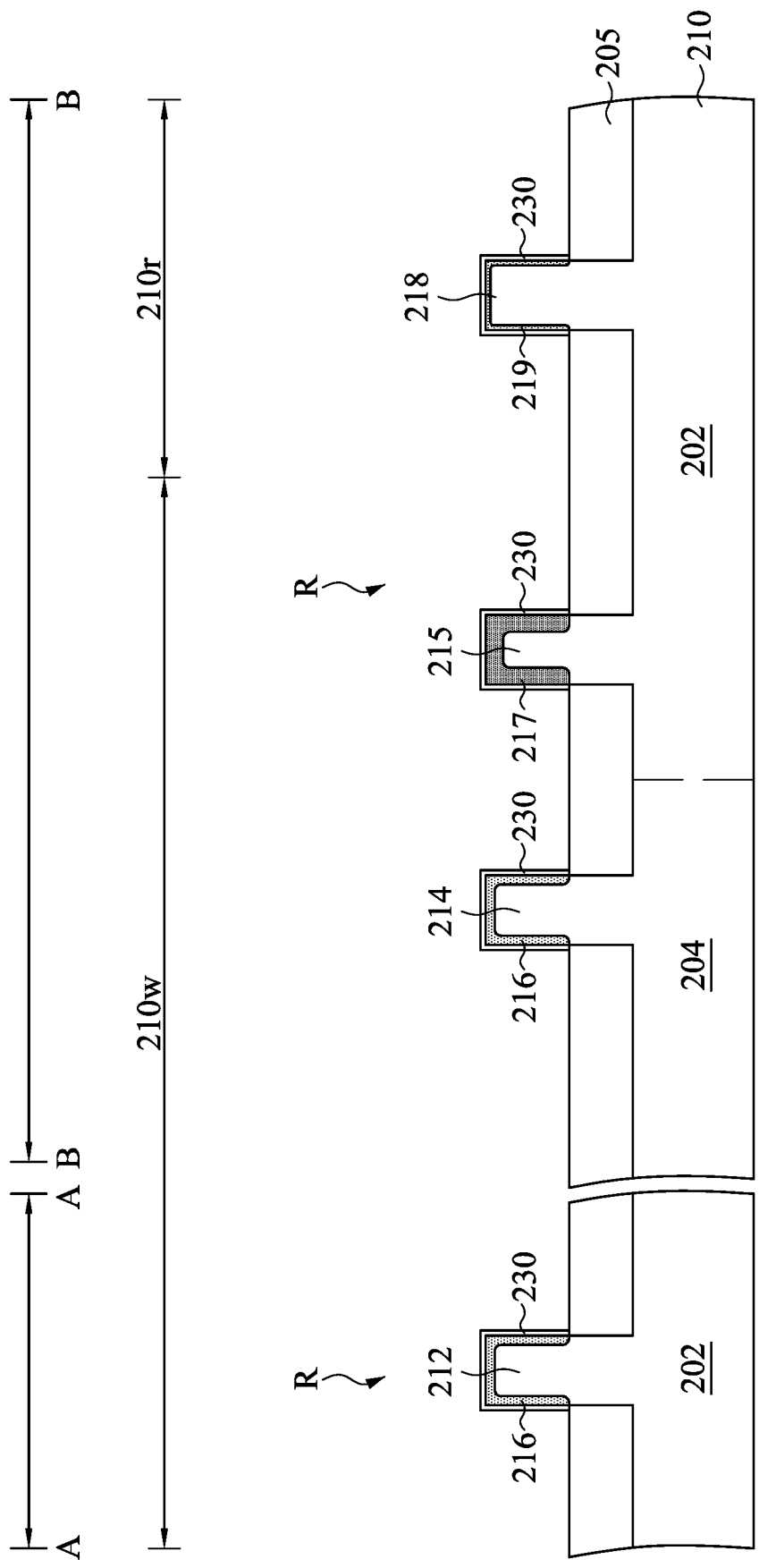

Reference is made to FIGS. 12A and 12B. A plurality of gate spacers (not shown) are formed over the substrate 210 and along the sides of the dummy gates 241, 243, 245, 247, and 249. A dielectric layer 250 is formed at outer sides of the gate spacers on the substrate 210. A replacement gate (RPG) process scheme is employed. In some embodiments, the dummy gates 241, 243, 245, 247, and 249 (see FIG. 10A) are removed to form recesses R with the gate spacers and the dielectric layer 250 as its sidewalls.

Figure 13A:
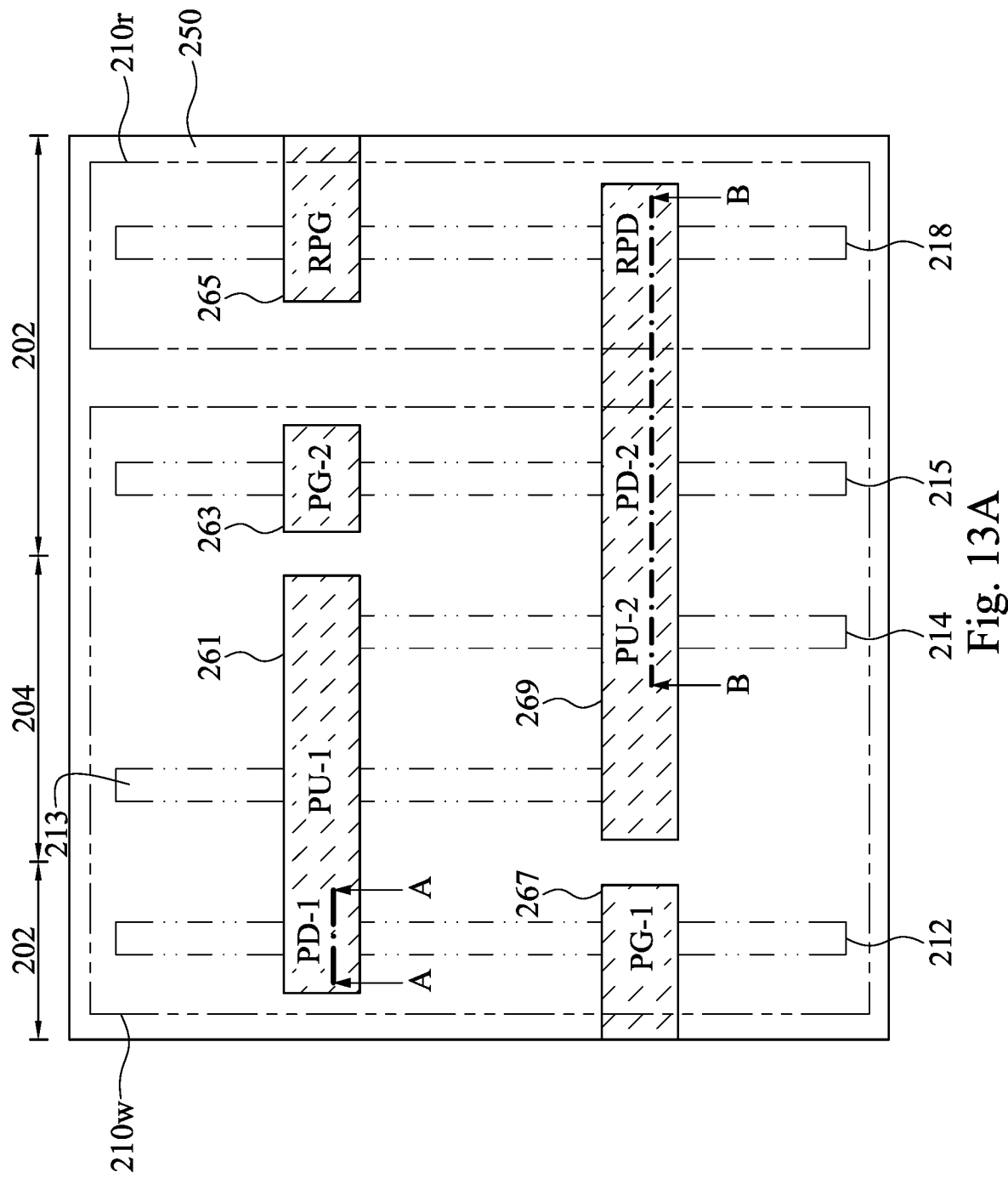
Figure 13B:
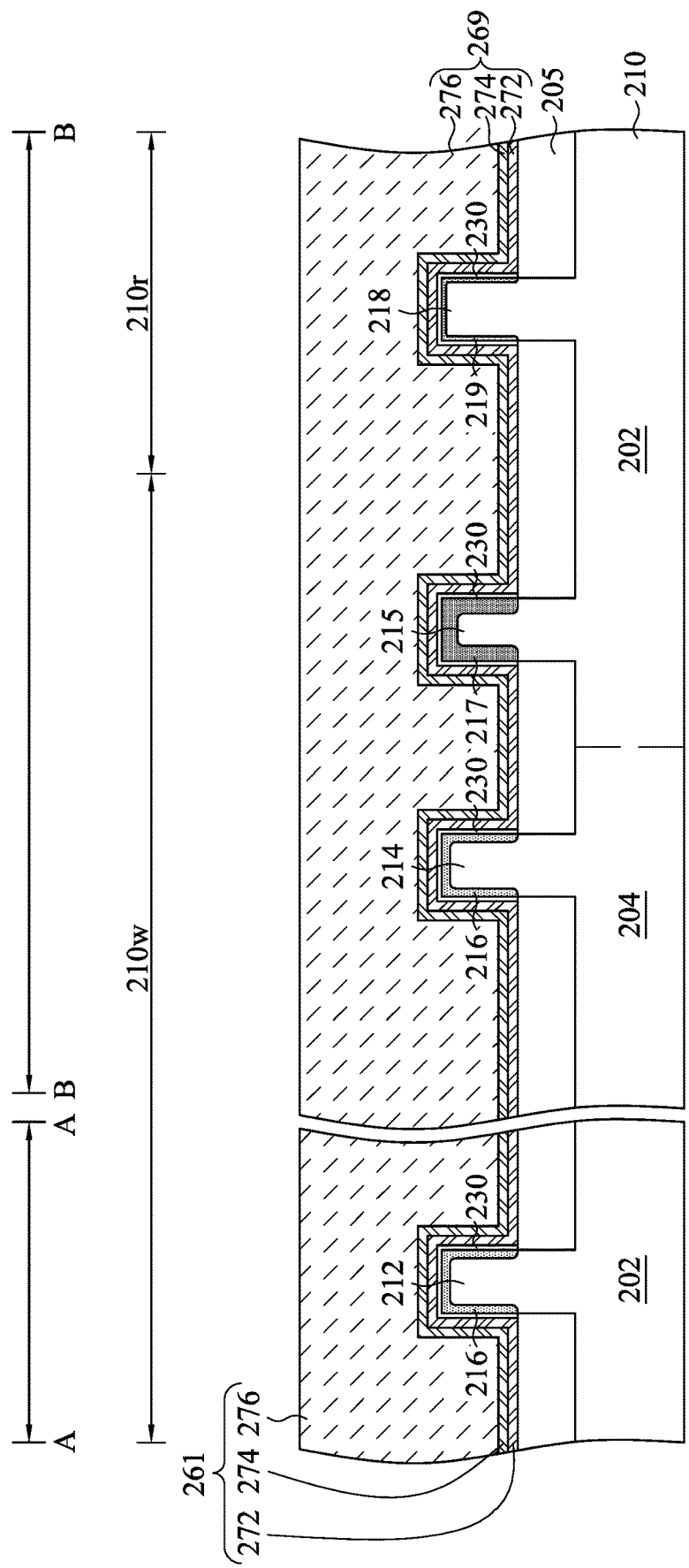

Reference is made to FIGS. 13A and 13B. A plurality of metal gates 261, 263, 265, 267, and 269 are respectively formed in the recesses R. In greater detail, a gate dielectric layer 272 is formed on the substrate 210 and in the recesses R. A work function metal layer 274 is then formed on the gate dielectric layer 272. The remaining recesses R are filled with a metal layer 276 on the work function metal layer 274. After forming the gate dielectric layer 272, the metal layer 274 and the metal layer 276, a planarization process may be performed to remove the metal gate layers from the surface of the dielectric layer 250.

In FIG. 13A, the semiconductor fin 212 and the metal gate 261 form a pull-down transistor PD-1, and the semiconductor fin 213 and the metal gate 261 form a pull-up transistor PU-1. In other words, the pull-down transistor PD-1 and the pull-up transistor PU-1 share the metal gate 261. The semiconductor fin 215 and the metal gate 263 form a pass-gate transistor PG-2. The semiconductor fin 218 and the metal gate 265 form a read-pass-gate transistor RPG. The semiconductor fin 212 and the metal gate 267 form another pass-gate transistor PG-1. The semiconductor fin 214 and the metal gate 269 form another pull-up transistor PU-2, the semiconductor fin 215 and the metal gate 269 form another pull-down transistor PD-2, and the semiconductor fin 218 and the metal gate 269 form a read-pull-down transistor RPD. In other words, the pull-up transistor PU-2, the pull-down transistor PD-2 and the read-pull-down transistor RPD share the metal gate 269. Therefore, the transistors in the write portion 210w (i.e., transistors PD-1, PD-2, PU-1, PU-2, PG-1, and PG-2) form a six-transistor (6T) SRAM, and the semiconductor device in FIG. 8A is an 8T-SRAM device. One of ordinary skill in the art, however, should understand that features of the various embodiments described herein may be used for forming other types of devices, such as a 10T-SRAM device or other integrated circuits.

According to some embodiments, a semiconductor device includes a substrate, a first transistor, and a second transistor. The first transistor is disposed on the substrate. The second transistor is disposed on the substrate. A gate of the first transistor and a gate of the second transistor are integrally formed, and the first transistor and the second transistor have different threshold voltages.

According to some embodiments, a semiconductor device includes a substrate, a first transistor, and a second transistor. The first transistor is disposed on the substrate and includes an active region and a metal gate. The active region includes a channel doping region therein. The metal gate is disposed on the active region of the first transistor. The second transistor is disposed on the substrate and adjacent to the first transistor. The second transistor includes an active region and the metal gate disposed on the active region of the second transistor.

According to some embodiments, a method for manufacturing a semiconductor device includes forming a first active region and a second active region in a substrate. The first active region is doped. A metal gate is integrally formed on the first active region and the second active region. The metal gate and the first active region form a first transistor, and the metal gate and the second active region form a second transistor.

In some embodiments, a static random access memory (SRAM) cell includes substrate, a first semiconductor fin, a first gate structure, a second semiconductor fin, and a second gate structure. The substrate has a first p-well and an n-well bordering the first p-well. The first semiconductor fin extends within the first p-well. The first gate structure extends across the first semiconductor fin and forms a first write-port pull-down transistor with the first semiconductor fin. The second semiconductor fin extends within the n-well. The second gate structure extends across the second semiconductor fin and forms a first write-port pull-up transistor with the second semiconductor fin. A channel region of the first write-port pull-down transistor has a higher doping concentration than a channel region of the first write-port pull-up transistor.

In some embodiments, a static random access memory (SRAM) cell includes a substrate, a first semiconductor fin, a second semiconductor fin, and a first gate structure. The substrate has a first p-well and an n-well adjacent the first p-well. The first semiconductor fin is over the first p-well. The second semiconductor fin is over the n-well. The first gate structure extends across the first and second semiconductor fins to form a first write-port pull-down transistor with the first semiconductor fin and a first write-port pull-up transistor with the second semiconductor fin. A channel region of the first write-port pull-down transistor has a higher doping concentration than a channel region of the first write-port pull-up transistor.

In some embodiments, a static random access memory (SRAM) cell includes first and second semiconductor fins and a first gate structure. The first and second semiconductor fins extend along a first direction over a p-well. The first gate structure extends along a second direction perpendicular to the first direction. The first gate structure forms a write-port pull-down transistor with the first semiconductor fin and forms a read-port pull-down transistor with the second semiconductor fin. The first gate structure has a continuous work function metal spanning at least the write-port pull-down transistor and the read-port pull-down transistor. The work function metal has a thickness in the write-port pull-down transistor substantially the same as in the read-port pull-down transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell comprising:
   a substrate having a first p-well and an n-well bordering the first p-well;
   a first semiconductor fin extending within the first p-well;
   a first gate structure extending across the first semiconductor fin and forming a first write-port pull-down transistor with the first semiconductor fin;
   a second semiconductor fin extending within the n-well;
   a second gate structure extending across the second semiconductor fin and forming a first write-port pull-up transistor with the second semiconductor fin, wherein a channel region of the first write-port pull-down transistor has a higher doping concentration than a channel region of the first write-port pull-up transistor; and
   a third semiconductor fin extending within a second p-well spaced from the first p-well by the n-well, wherein the second gate structure extends across the third semiconductor fin and forms a second write-port pull-down transistor with the third semiconductor fin, and a channel region of the second write-port pull-down transistor has a lower doping concentration than the channel region of the first write-port pull-down transistor, but a threshold voltage of the second write-port pull-down transistor is same as a threshold voltage of the first write-port pull-down transistor.

2. The SRAM cell of claim 1, further comprising:
   a fourth semiconductor fin extending within the first p-well and forming a read-port pull-down transistor with the first gate structure.

3. The SRAM cell of claim 2, wherein a channel region of the read-port pull-down transistor has a lower doping concentration than the channel region of the first write-port pull-down transistor.

4. The SRAM cell of claim 2, further comprising:
   a third gate structure extending across the fourth semiconductor fin and forming a read-port pass-gate transistor with the third semiconductor fin, wherein a channel region of the read-port pull-down transistor has a lower doping concentration than the channel region of the first write-port pull-down transistor.

5. The SRAM cell of claim 4, wherein the third gate structure is substantially aligned with the second gate structure.

6. The SRAM cell of claim 1, further comprising:
   a third gate structure extending across the first semiconductor fin and forming a write-port pass-gate transistor with the first semiconductor fin, wherein a channel region of the write-port pass-gate transistor has a lower doping concentration than the channel region of the first write-port pull-down transistor.

7. The SRAM cell of claim 6, where the third gate structure is substantially aligned with the second gate structure.

8. The SRAM cell of claim 1, further comprising:
   a third gate structure extending across the third semiconductor fin and forming a write-port pass-gate transistor with the third semiconductor fin, wherein a channel region of the write-port pass-gate transistor has a lower doping concentration than the channel region of the first write-port pull-down transistor.

9. The SRAM cell of claim 8, wherein the third gate structure is substantially aligned with the first gate structure.

10. The SRAM cell of claim 1, wherein the first gate structure is misaligned with the second gate structure.

11. A static random access memory (SRAM) cell comprising:
a substrate having a first p-well and an n-well adjacent the first p-well;
a first semiconductor fin over the first p-well;
a second semiconductor fin over the n-well;
a first gate structure extending across the first and second semiconductor fins to form a first write-port pull-down transistor with the first semiconductor fin and a first write-port pull-up transistor with the second semiconductor fin, wherein a channel region of the first write-port pull-down transistor has a higher doping concentration than a channel region of the first write-port pull-up transistor; and
a second write-port pull-down transistor over a second p-well, wherein a channel region of the second write-port pull-down transistor has a lower doping concentration than the channel region of the first write-port pull-down transistor, but a threshold voltage of the second write-port pull down transistor is same as a threshold voltage of the first write-port pull down transistor.

12. The SRAM cell of claim 11, further comprising:
a third semiconductor fin spaced from the second semiconductor fin in part by the first semiconductor fin, wherein the first gate structure extends across the third semiconductor fin and forms a read-port pull-down transistor with third semiconductor fin, and a channel region of the read-port pull-down transistor has a lower doping concentration than the channel region of the first write-port pull-down transistor.

13. The SRAM cell of claim 12, further comprising:
a second gate structure extending across the third semiconductor fin and forming a read-port pass-gate transistor with the third semiconductor fin, wherein a channel region of the read-port pass-gate transistor has a lower doping concentration than the channel region of the first write-port pull-down transistor.

14. The SRAM cell of claim 11, further comprising:
a second gate structure extending across the first semiconductor fin and forming a write-port pass-gate transistor with the first semiconductor fin, wherein a channel region of the write-port pass-gate transistor has a lower doping concentration than the channel region of the first write-port pull-down transistor.

15. The SRAM cell of claim 11, further comprising:
a write-port pass-gate transistor over a second p-well spaced from the first p-well by the n-well, wherein a channel region of the write-port pass-gate transistor has a lower doping concentration than the channel region of the first write-port pull-down transistor.

16. The SRAM cell of claim 11, wherein the first semiconductor fin has a length greater than a length of the second semiconductor fin.

17. The SRAM cell of claim 11, wherein the channel region of the first write-port pull-down transistor has a doped top surface and doped sidewalls.

18. The SRAM cell of claim 11, wherein the n-well is between the first p-well and the second p-well.

19. A static random access memory (SRAM) cell comprising:
first and second semiconductor fins extending along a first direction over a first p-well;
a first gate structure extending along a second direction perpendicular to the first direction, the first gate structure forming a first write-port pull-down transistor with the first semiconductor fin and a read-port pull-down transistor with the second semiconductor fin,
wherein the first gate structure has a continuous work function metal spanning at least the first write-port pull-down transistor and the read-port pull-down transistor, and the work function metal has a thickness in the first write-port pull-down transistor substantially the same as in the read-port pull-down transistor;
a third semiconductor fin extending along the first direction over a second p-well spaced from the first p-well; and
a second gate structure extending along the second direction and forming a second write-port pull-down transistor with the third semiconductor fin, wherein a channel region of the second write-port pull-down transistor has a lower doping concentration than the channel region of the first write-port pull-down transistor, but a threshold voltage of the second write-port pull-down transistor is same as a threshold voltage of the first write-port pull-down transistor.

20. The SRAM cell of claim 19, wherein the first write-port pull-down transistor having a channel doping concentration higher than a channel doping concentration of the read-port pull-down transistor.

* * * * *